(12) United States Patent
Sugihara et al.

(10) Patent No.: US 11,004,657 B2
(45) Date of Patent: May 11, 2021

(54) MULTIPLE ELECTRON BEAM IRRADIATION APPARATUS, MULTIPLE ELECTRON BEAM INSPECTION APPARATUS, AND MULTIPLE ELECTRON BEAM IRRADIATION METHOD

(71) Applicant: NuFlare Technology, Inc., Yokohama (JP)

(72) Inventors: Shinji Sugihara, Ota-ku (JP); Riki Ogawa, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/697,248

(22) Filed: Nov. 27, 2019

(65) Prior Publication Data

US 2020/0234919 A1 Jul. 23, 2020

(30) Foreign Application Priority Data

Jan. 22, 2019 (JP) .............................. JP2019-008202

(51) Int. Cl.
*H01J 37/317* (2006.01)
*H01J 37/30* (2006.01)
*H01J 37/302* (2006.01)
*H01J 37/304* (2006.01)
*G03F 7/20* (2006.01)

(52) U.S. Cl.
CPC ........ *H01J 37/3177* (2013.01); *H01J 37/302* (2013.01); *H01J 37/304* (2013.01); *G03F 7/2059* (2013.01)

(58) Field of Classification Search
CPC .... H01J 37/3177; H01J 37/302; H01J 37/304; G03F 7/2059
See application file for complete search history.

(56) References Cited

U.S. PATENT DOCUMENTS

| | | | |
|---|---|---|---|
| 8,153,996 B2* | 4/2012 | Abe ..................... | H01J 37/3174 250/492.22 |
| 2005/0072941 A1* | 4/2005 | Tanimoto .............. | H01J 37/317 250/492.22 |
| 2008/0050848 A1* | 2/2008 | Abe ....................... | H01J 37/28 438/14 |

(Continued)

FOREIGN PATENT DOCUMENTS

JP 2013-128032 A 6/2013

*Primary Examiner* — Sean M Luck
(74) *Attorney, Agent, or Firm* — Oblon, McClelland, Maier & Neustadt, L.L.P.

(57) ABSTRACT

A multiple electron beam irradiation apparatus includes a first region setting circuit which sets a first frame region of a plurality of first frame regions which can be irradiated with remaining beams after excluding beams in one row and one column at end; a second region setting circuit which sets a second frame region of a plurality of second frame regions each having four corners equivalent to an irradiation position of the defective beam by using normal beams; and an electron beam irradiation mechanism which performs the first multiple electron beam irradiation processing for the each of the plurality of first frame regions of the target object by using the normal beams, and perform second multiple electron beam irradiation processing for each of the plurality of second frame regions by using at least beams at the four corners.

6 Claims, 24 Drawing Sheets

(56) References Cited

U.S. PATENT DOCUMENTS

| | | | |
|---|---|---|---|
| 2009/0200495 A1* | 8/2009 | Platzgummer | B82Y 40/00 |
| | | | 250/492.22 |
| 2013/0068962 A1* | 3/2013 | Kawamoto | H01J 37/304 |
| | | | 250/400 |
| 2013/0157198 A1 | 6/2013 | Yoshikawa et al. | |
| 2013/0252145 A1* | 9/2013 | Matsumoto | H01J 37/3177 |
| | | | 430/30 |
| 2015/0155130 A1* | 6/2015 | Kikuchi | H01J 37/3177 |
| | | | 250/492.22 |
| 2015/0170878 A1* | 6/2015 | Sugiyama | H01J 37/3177 |
| | | | 250/492.22 |
| 2016/0064179 A1* | 3/2016 | Yamashita | H01J 37/20 |
| | | | 250/396 R |
| 2017/0103869 A1* | 4/2017 | Matsumoto | H01J 37/3177 |

* cited by examiner

Set A $\left\{ \begin{array}{cccccc} (0,5) & (2,1) & (2,6) & (3,-1) & (3,4) & (5,0) \\ (0,-5) & (-2,-1) & (-2,-6) & (-3,1) & (-3,-4) & (-5,0) \end{array} \right\}$

⇩

Set A' $\left\{ \begin{array}{ccc} (2,1) & (3,-1) & (3,4) \\ (-2,-1) & (-3,1) & (-3,-4) \end{array} \right\}$

⇩

Shift Vector (1,3)

FIG.16

MULTIPLE ELECTRON BEAM IRRADIATION APPARATUS, MULTIPLE ELECTRON BEAM INSPECTION APPARATUS, AND MULTIPLE ELECTRON BEAM IRRADIATION METHOD

CROSS-REFERENCE TO RELATED APPLICATION

This application is based upon and claims the benefit of priority from prior Japanese Patent Application No. 2019-008202 filed on Jan. 22, 2019 in Japan, the entire contents of which are incorporated herein by reference.

BACKGROUND OF THE INVENTION

Field of the Invention

Embodiments of the present invention relate to a multiple electron beam irradiation apparatus and a multiple electron beam irradiation method. For example, embodiments of the present invention relate to an inspection apparatus for inspecting a pattern by using a secondary electron image of the pattern emitted by irradiation with multiple electron beams.

Description of Related Art

In recent years, with the advance of high integration and large capacity of LSI (Large Scale Integrated circuits), the line width (critical dimension) required for circuits of semiconductor elements is becoming progressively narrower. Since LSI manufacturing requires a tremendous amount of manufacturing cost, it is crucially essential to improve its yield. As the scale of patterns configuring an LSI is becoming on the order of 10 nanometers or less, dimensions to be detected as a pattern defect have become extremely small. Therefore, the pattern inspection apparatus for inspecting defects of ultrafine patterns exposed/transferred onto a semiconductor wafer needs to be highly accurate. Further, one of major factors that decrease the yield of the LSI manufacturing is due to pattern defects on the mask used for exposing/transferring an ultrafine pattern onto a semiconductor wafer by the photolithography technology. Therefore, the pattern inspection apparatus for inspecting defects on a transfer mask used in manufacturing LSI needs to be highly accurate.

As a defect inspection method, there is known a method of comparing a measured image acquired by imaging a pattern formed on a substrate, such as a semiconductor wafer or a lithography mask, with design data or with another measured image acquired by imaging the same pattern on the substrate. For example, as a pattern inspection method, there are "die-to-die inspection" and "die-to-database inspection". The "die-to-die inspection" method compares data of measured images acquired by imaging the same patterns at different positions on the same substrate. The "die-to-database inspection" method generates, based on pattern design data, design image data (reference image) to be compared with a measured image being measured data acquired by imaging a pattern. Then, acquired images are transmitted as measured data to the comparison circuit. After performing alignment between images, the comparison circuit compares the measured data with reference data according to an appropriate algorithm, and determines that there is a pattern defect if the compared data do not match with each other.

Specifically with respect to the pattern inspection apparatus described above, in addition to the type of apparatus that irradiates an inspection substrate with laser beams in order to obtain a transmission image or a reflection image of a pattern formed on the substrate, there has been developed another type of inspection apparatus that acquires a pattern image by scanning the inspection substrate with electron beams and detecting secondary electrons emitted from the inspection substrate by the irradiation with the electron beams. Regarding the inspection apparatus utilizing electron beams, an apparatus using multiple electron beams has also been under development. Since a lot of beams are used in the multiple electron beam apparatus, the frequency that a defect occurs in a partial beam is stochastically high. If a defective beam is generated, an image to be inspected is no longer obtained, or even if obtained, since the image accuracy degrades, it becomes difficult to perform a sufficient inspection. For example, in the case of inspection using one hundred electron beams as multiple electron beams, if one beam is defective even though ninety-nine beams are normal, it may be impossible to perform inspection due to the one defective beam. When it is unable to perform inspection until the defective beam has been corrected, such state largely spoils the convenience of the apparatus in the manufacturing field. As a defective beam, for example, there is an "always Off" beam which is continuously "beam Off" because "beam On" control cannot be performed. Moreover, as a defective beam, there is a beam from which a predetermined amount of beam current cannot be obtained even though the "beam On" control can be performed. This problem is applicable to all the apparatuses, such as an inspection apparatus, that acquire an image with multiple electron beams. Further, this problem is also applicable to an exposure apparatus, such as a writing or "drawing" apparatus which writes a pattern, in addition to the apparatuses that acquire an image. Since the dose is controlled based on an irradiation time in the writing apparatus, there is a beam, as a defective beam, which is "always On" continuously irradiating the target object because "beam Off" control (blanking) cannot be performed. In addition, as a defective beam, there is a beam whose dose cannot be controlled with desired accuracy because of poor responsiveness even when "beam On" control and "beam Off" control are performed during a predetermined irradiation time.

With respect to multiple electron beam writing, even when exists a defective beam such as an "always Off" beam, an "always On" beam, or a beam whose dose cannot be controlled with desired precision, there is disclosed a method of writing a pattern on the target object (the first mode, mode 1) by setting a partial region such that the partial region includes openings as many as possible out of a plurality of openings in the aperture member for forming multiple beams, excluding an opening(s) through which the defective beam(s) passes, and by using the multiple beams having passed through the openings in the partial region. There is also disclosed a method of performing multiple writing while shifting a position by using at least one of remaining multiple beams in the state where a defective beam is controlled (blanking controlled) to be "beam Off", and of further performing additional writing for a position which was supposed to be written by the defective beam, (the second mode, mode 2). Moreover, there is disclosed a technique of selecting either one of the first mode and the second mode (e.g., refer to Japanese Patent Application Laid-open (JP-A) No. 2013-128032).

BRIEF SUMMARY OF THE INVENTION

According to one aspect of the present invention, a multiple electron beam irradiation apparatus includes:

a stage which mounts thereon a target object;

a first region setting circuit, in a case of a defective beam existing at a position other than four corners of multiple electron beams of m rows×n columns (where m and n are integers of 3 or more), which sets a first frame region of a plurality of first frame regions obtained by virtually dividing a beam irradiation target region of the target object by a size of an irradiation region which can be irradiated with remaining beams after excluding beams in one row and one column at end from the multiple electron beams;

a second region setting circuit which sets a second frame region of a plurality of second frame regions each having four corners equivalent to an irradiation position of the defective beam in a case of performing first multiple electron beam irradiation processing for each of the plurality of first frame regions by using normal beams in the remaining beams; and an electron beam irradiation mechanism which performs the first multiple electron beam irradiation processing for the each of the plurality of first frame regions of the target object by using the normal beams, and perform second multiple electron beam irradiation processing for each of the plurality of second frame regions by using at least beams at the four corners.

According to another aspect of the present invention, a multiple electron beam irradiation apparatus includes:

a stage which mounts thereon a target object;

a first region setting circuit which sets a first frame region of a plurality of first frame regions obtained by virtually dividing a beam irradiation target region of the target object by a size of an irradiation region which can be irradiated with multiple electron beams of m rows×n columns (where m and n are integers of 3 or more);

a vector calculation circuit, in a case of the multiple electron beams including a plurality of defective beams, which calculates a vector between regions equivalent to irradiation positions of the plurality of defective beams in a case where first multiple electron beam irradiation processing is performed for each of the plurality of first frame regions by using normal beams of the multiple electron beams;

a second region setting circuit which sets a second frame region of a plurality of second frame regions obtained by shifting the plurality of first frame regions to a vector which does not belong to a set of calculated vectors between the regions; and an electron beam irradiation mechanism which performs the first multiple electron beam irradiation processing for the each of the plurality of first frame regions by using the normal beams, and perform second multiple electron beam irradiation processing for each of the plurality of second frame regions by using normal beams which are associated with the irradiation positions of the plurality of defective beams in the second frame region.

According to yet another aspect of the present invention, a multiple electron beam inspection apparatus includes:

a stage which mounts thereon a target object;

a region setting circuit, in a case of multiple electron beams of m rows×n columns (where m and n are integers of 2 or more) including a defective beam, which sets a frame region of a plurality of frame regions obtained by virtually dividing a beam irradiation target region of the target object by a size of a rectangle which can be irradiated with normal beams excluding the defective beam;

an image acquisition mechanism which acquires, in each of the plurality of frame regions, a secondary electron image by detecting multiple secondary electron beams emitted from the each of the plurality of frame regions because of being irradiated with beams, in the normal beams, which can irradiate at least inside the rectangle; and an inspection circuit which inspects an acquired secondary electron image.

According to yet another aspect of the present invention, a multiple electron beam irradiation method includes:

setting, in a case of a defective beam existing at a position other than four corners of multiple electron beams of m rows×n columns (where m and n are integers of 3 or more), a first frame region of a plurality of first frame regions obtained by virtually dividing a beam irradiation target region of a target object placed on a stage by a size of an irradiation region which can be irradiated with remaining beams after excluding beams in one row and one column at end from the multiple electron beams;

setting a second frame region of a plurality of second frame regions each having four corners equivalent to an irradiation position of the defective beam in a case of performing first multiple electron beam irradiation processing for each of the plurality of first frame regions by using normal beams in the remaining beams;

performing the first multiple electron beam irradiation processing for the each of the plurality of first frame regions of the target object by using the normal beams; and performing second multiple electron beam irradiation processing for each of the plurality of second frame regions by using at least beams at the four corners.

According to yet another aspect of the present invention, a multiple electron beam irradiation apparatus includes:

a stage which mounts thereon a target object;

a specification circuit which specifies a defective beam in multiple electron beams of m rows×n columns (where m and n are integers of 3 or more);

a selection circuit which selects, depending on a position of the defective beam specified, one of a plurality of irradiation processing methods whose irradiation processing time is shortest; and an electron beam irradiation mechanism which performs multiple electron beam irradiation processing on the target object based on a selected method.

BRIEF DESCRIPTION OF THE DRAWINGS

FIG. 16 shows an example of a vector set according to the second embodiment;

DETAILED DESCRIPTION OF THE INVENTION

Embodiments below describe an apparatus and method that can apply beam irradiation achieving desired accuracy and speed even when a defective beam exists in multiple electron beams.

First Embodiment

Figure 1:
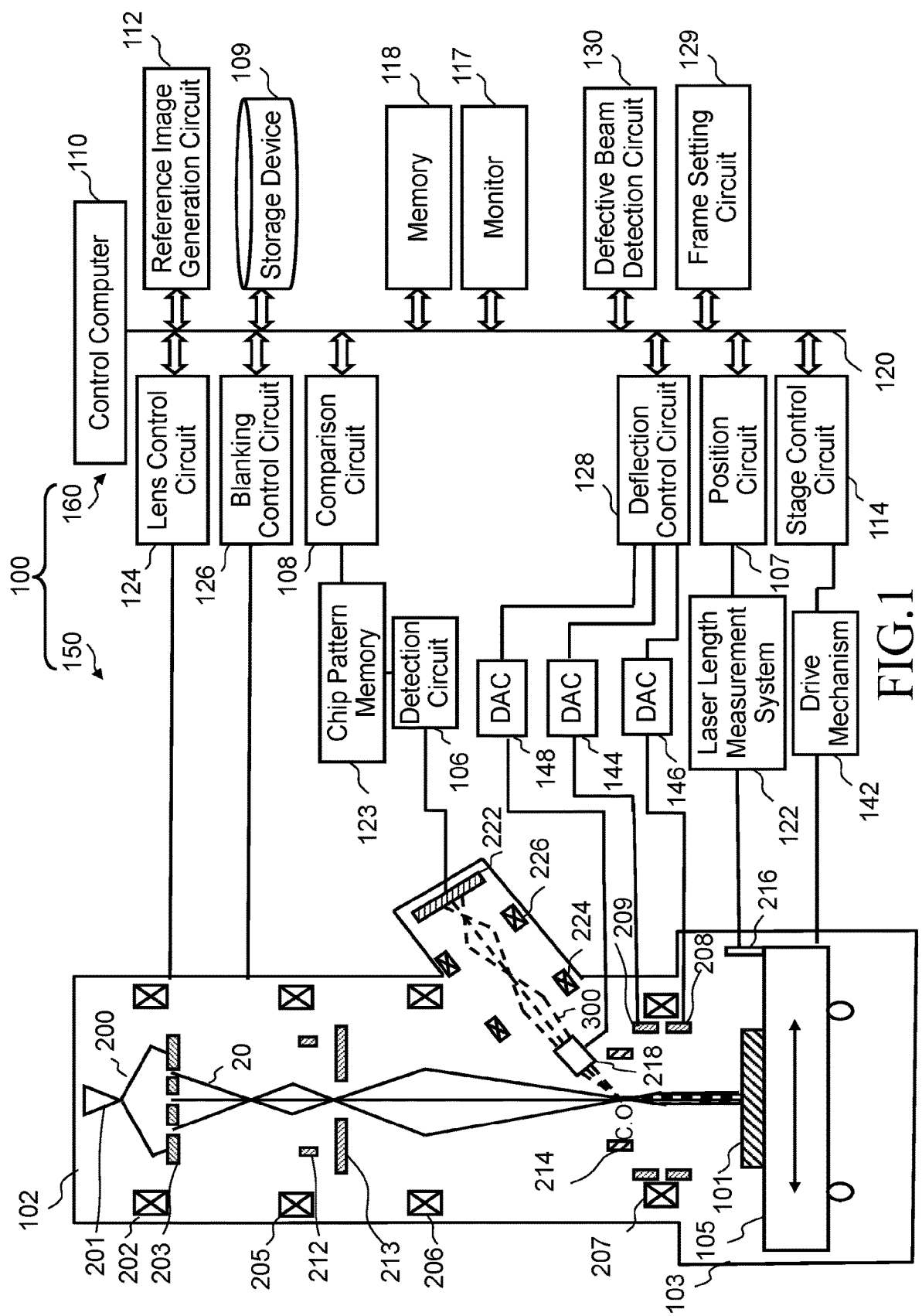
FIG. 1 is a block diagram showing an example of a configuration of a pattern inspection apparatus according to a first embodiment.

FIG. 1 is a block diagram showing an example of a configuration of a pattern inspection apparatus according to a first embodiment. In FIG. 1, an inspection apparatus 100 for inspecting patterns formed on a substrate is an example of a multiple electron beam inspection apparatus. The inspection apparatus 100 includes an image acquisition mechanism 150 (secondary electron image acquisition mechanism) and a control system circuit 160. The image acquisition mechanism 150 includes an electron beam column 102 (electron optical column) and an inspection chamber 103. In the electron beam column 102, there are disposed an electron gun 201, an electromagnetic lens 202, a shaping aperture array substrate 203, an electromagnetic lens 205, a common blanking deflector 212, a limiting aperture substrate 213, an electromagnetic lens 206, an electromagnetic lens 207 (objective lens), a main deflector 208, a sub deflector 209, a beam separator 214, a deflector 218, an electromagnetic lens 224, an electromagnetic lens 226, and a multi-detector 222.

A stage 105 movable at least in the x, y, and z directions is disposed in the inspection chamber 103. A substrate 101 (target object) to be inspected is mounted on the stage 105. The substrate 101 may be an exposure mask substrate, or a semiconductor substrate such as a silicon wafer. When the substrate 101 is a semiconductor substrate, a plurality of chip patterns (wafer dies) are formed on the semiconductor substrate. When the substrate 101 is an exposure mask substrate, a chip pattern is formed on the exposure mask substrate. The chip pattern is composed of a plurality of figure patterns. If the chip pattern formed on the exposure mask substrate is exposed/transferred onto the semiconductor substrate a plurality of times, a plurality of chip patterns (wafer dies) are formed on the semiconductor substrate. The case of the substrate 101 being a semiconductor substrate is described below mainly. The substrate 101 is placed with its pattern-forming surface facing upward on the stage 105, for example. Moreover, on the stage 105, there is disposed a mirror 216 which reflects a laser beam for measuring a laser length emitted from the laser length measuring system 122 disposed outside the inspection chamber 103. The multi-detector 222 is connected, at the outside of the electron beam column 102, to the detection circuit 106. The detection circuit 106 is connected to a chip pattern memory 123.

In the control system circuit 160, a control computer 110 which controls the whole of the inspection apparatus 100 is connected, through a bus 120, to a position circuit 107, a comparison circuit 108, a reference image generation circuit 112, a stage control circuit 114, a lens control circuit 124, a blanking control circuit 126, a deflection control circuit 128, a frame setting circuit 129, a defective beam detection circuit 130, a storage device 109 such as a magnetic disk drive, a monitor 117, and a memory 118. The deflection control circuit 128 is connected to DAC (digital-to-analog conversion) amplifiers 144, 146 and 148. The DAC amplifier 146 is connected to the main deflector 208, and the DAC amplifier 144 is connected to the sub deflector 209. The DAC amplifier 148 is connected to the deflector 218.

The chip pattern memory 123 is connected to the comparison circuit 108. The stage 105 is driven by the drive mechanism 142 under the control of the stage control circuit 114. In the drive mechanism 142, a drive system such as a three (x-, y-, and θ-) axis motor which provides drive in the directions of x, y, and θ in the stage coordinate system is configured, and can move the stage 105 in the x, y, and θ directions. A step motor, for example, can be used as each of these x, y, and θ motors (not shown). The stage 105 is movable in the horizontal direction and the rotation direction by the X-, Y-, and θ-axis motors. Further, the stage 105 is movable in the z direction (height direction) by using a piezoelectric element, etc., for example. The movement position of the stage 105 is measured by the laser length measuring system 122, and supplied (transmitted) to the position circuit 107. Based on the principle of laser interferometry, the laser length measuring system 122 measures the position of the stage 105 by receiving a reflected light from the mirror 216. In the stage coordinate system, the x, y, and θ directions are set with respect to a plane orthogonal to the optical axis (center axis of electron trajectory) of the multiple primary electron beams, for example.

The electromagnetic lenses 202, 205, 206, 207 (objective lens), 224 and 226, and the beam separator 214 are controlled by the lens control circuit 124. The common blanking deflector 212 is configured by two or more electrodes (or "two or more poles"), and each electrode is controlled by the blanking control circuit 126 through a DAC amplifier (not shown). The sub deflector 209 is configured by four or more electrodes (or "four or more poles"), and each electrode is controlled by the deflection control circuit 128 through the DAC amplifier 144. The main deflector 208 is configured by four or more electrodes (or "four or more poles"), and each electrode is controlled by the deflection control circuit 128 through the DAC amplifier 146. The deflector 218 is configured by four or more electrodes (or "four or more poles"), and each electrode is controlled by the deflection control circuit 128 through the DAC amplifier 148.

To the electron gun 201, there is connected a high voltage power supply circuit (not shown). The high voltage power supply circuit applies an acceleration voltage between a filament (cathode) and an extraction electrode (anode) (which are not shown) in the electron gun 201. In addition to the applying the acceleration voltage, applying a voltage to another extraction electrode (Wehnelt) and heating the cathode to a predetermined temperature are performed, and thereby, electrons from the cathode are accelerated to be emitted as an electron beam 200.

FIG. 1 shows configuration elements necessary for describing the first embodiment. It should be understood that other configuration elements generally necessary for the inspection apparatus 100 may also be included therein.

Figure 2:
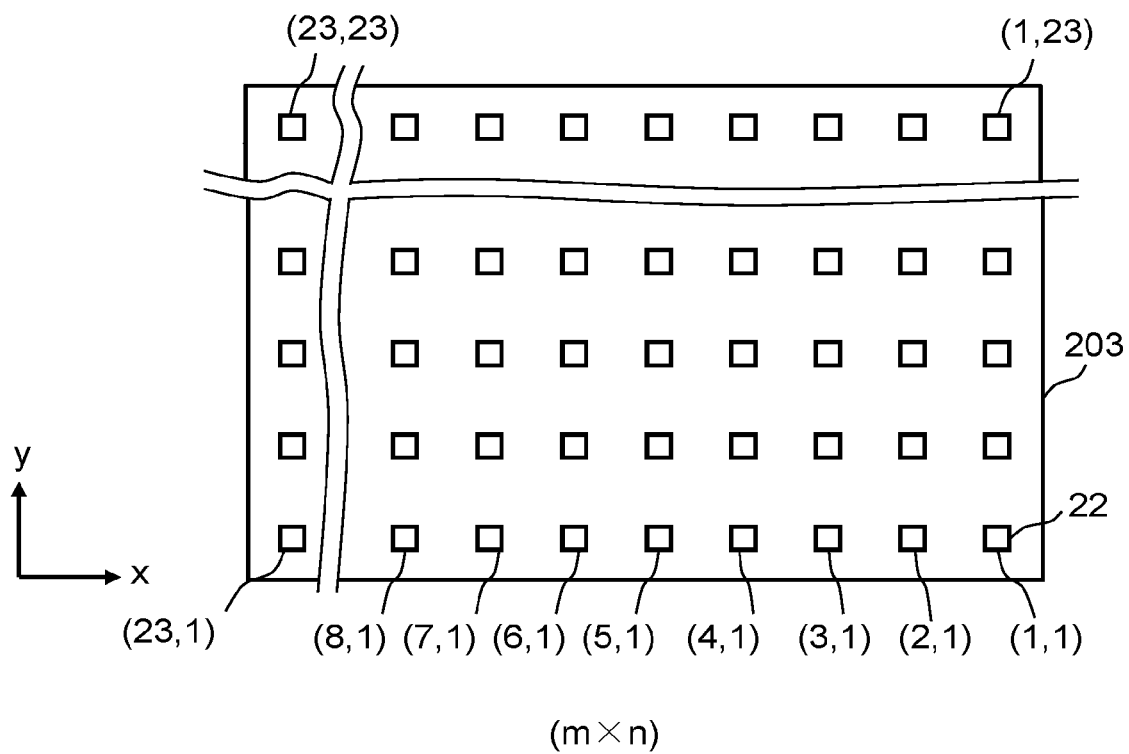
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of m rows long (length in the y direction) (each row in the x direction) and n columns wide (width in the x direction) (each column in the y direction) are two-dimensionally formed at a predetermined arrangement pitch in the shaping aperture array substrate 203, where m and n are integers of 3 or more. In the case of FIG. 2, holes 22 of 23×23 are formed. Ideally, each of the holes 22 is a rectangle (including a square) having the same dimension, shape, and size. Alternatively, ideally, each of the holes 22 may be a circle with the same outer diameter. Multiple primary electron beams 20 are formed by letting portions of the electron beam 200 individually pass through a corresponding one of a plurality of holes 22.

Next, operations of the image acquisition mechanism 150 in the inspection apparatus 100 will be described below.

The electron beam 200 emitted from the electron gun 201 (emission source) is refracted by the electromagnetic lens 202, and illuminates the whole of the shaping aperture array substrate 203. As shown in FIG. 2, a plurality of holes 22 (openings) are formed in the shaping aperture array substrate 203. The region including all the plurality of holes 22 is irradiated by the electron beam 200. The multiple primary electron beams 20 are formed by letting portions of the electron beam 200, which irradiate the positions of a plurality of holes 22, individually pass through a corresponding one of the plurality of holes 22 in the shaping aperture array substrate 203.

The formed multiple primary electron beams 20 are individually refracted by the electromagnetic lenses 205 and 206, and travel to the electromagnetic lens 207 (objective lens) while repeating forming an intermediate image and a crossover through the beam separator 214 disposed at the crossover position of each beam of the multiple primary electron beams 20. Then, the electromagnetic lens 207 focuses the multiple primary electron beams 20 onto the substrate 101. The multiple primary electron beams 20 having been focused on the substrate 101 (target object) by the objective lens 207 are collectively deflected by the main deflector 208 and the sub deflector 209 to irradiate respective beam irradiation positions on the substrate 101. When all of the multiple primary electron beams 20 are collectively deflected by the common blanking deflector 212, they deviate from the hole in the center of the limiting aperture substrate 213 and blocked by the limiting aperture substrate 213. On the other hand, the multiple primary electron beams 20 which were not deflected by the common blanking deflector 212 pass through the hole in the center of the limiting aperture substrate 213 as shown in FIG. 1. Blanking control is provided by On/Off of the common blanking deflector 212 to collectively control On/Off of the multiple beams. Thus, the limiting aperture substrate 213 blocks the multiple primary electron beams 20 which were deflected to be in the "Off condition" by the common blanking deflector 212. Then, the multiple primary electron beams 20 for inspection (for image acquisition) are formed by the beams having been made during a period from becoming "beam On" to becoming "beam Off" and having passed through the limiting aperture substrate 213.

When desired positions on the substrate 101 are irradiated with the multiple primary electron beams 20, a flux of secondary electrons (multiple secondary electron beams 300) including reflected electrons each corresponding to each of the multiple primary electron beams 20 is emitted from the substrate 101 due to the irradiation by the multiple primary electron beams 20.

The multiple secondary electron beams 300 emitted from the substrate 101 travel to the beam separator 214 through the electromagnetic lens 207.

The beam separator 214 generates an electric field and a magnetic field to be orthogonal to each other in a plane perpendicular to the traveling direction of the center beam of the multiple primary electron beams 20 (that is, electron trajectory central axis). The electric field affects (exerts a force) in the same fixed direction regardless of the traveling direction of electrons. In contrast, the magnetic field affects (exerts a force) according to Fleming's left-hand rule. Therefore, the direction of force acting on (applied to) electrons can be changed depending on the traveling (or "entering") direction of the electrons. With respect to the multiple primary electron beams 20 entering the beam separator 214 from the upper side, since the force due to the electric field and the force due to the magnetic field cancel each other out, the multiple primary electron beams 20 travel straight downward. In contrast, with respect to the multiple secondary electron beams 300 entering the beam separator 214 from the lower side, since both the force due to the electric field and the force due to the magnetic field are exerted in the same direction, the multiple secondary electron beams 300 are bent obliquely upward, and separated from the multiple primary electron beams 20.

The multiple secondary electron beams 300 having been bent obliquely upward and separated from the multiple primary electron beams 20 are further bent by the deflector 218, and projected, while being refracted, onto the multi-detector 222 by the electromagnetic lenses 224 and 226. The multi-detector 222 detects the projected multiple secondary electron beams 300. It is acceptable that reflected electrons and secondary electrons are projected on the multi-detector 222, or that reflected electrons are emitted on the way and remaining secondary electrons are projected. The multi-detector 222 includes a two-dimensional sensor (not shown), for example. Each secondary electron of the multiple secondary electron beams 300 collides with a corresponding region of the two-dimensional sensor, generates an electron, and generates secondary electron image data for each pixel. In other words, in the multi-detector 222, a detection sensor is disposed for each primary electron beam 10$i$ of the multiple primary electron beams 20, where i indicates an index, and i=1 to 529 in the case of the multiple primary electron beams 20 being composed of 23×23 beams. Then, the detection sensor detects a corresponding secondary electron beam emitted by irradiation with each primary electron beam 10$i$. Therefore, each of a plurality of detection sensors of the multi-detector 222 detects an intensity signal of a secondary electron beam for an image resulting from irradiation with a corresponding primary electron beam 10$i$. The intensity signal detected by the multi-detector 222 is output to the detection circuit 106.

Figure 3:
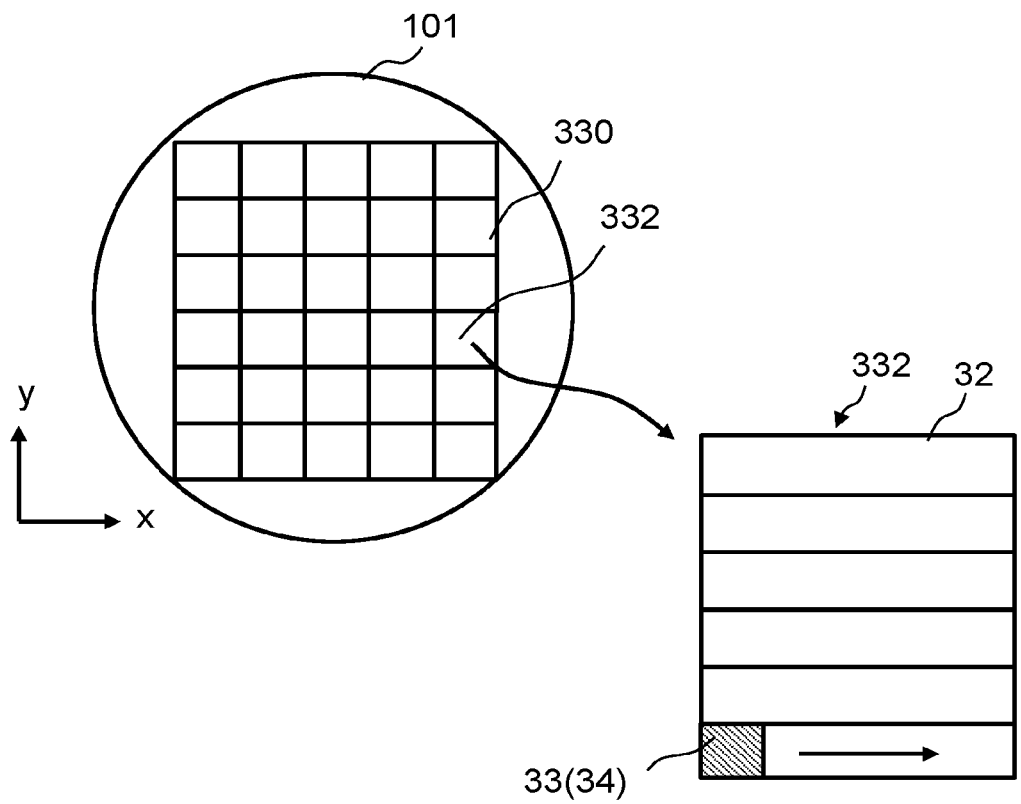
FIG. 3 shows an example of a plurality of chip regions formed on a semiconductor substrate, according to the first embodiment.

FIG. 3 shows an example of a plurality of chip regions formed on a semiconductor substrate, according to the first embodiment. In FIG. 3, in the case of the substrate 101 being a semiconductor substrate (wafer), a plurality of chips (wafer dies) 332 in a two-dimensional array are formed in an inspection region 330 of the semiconductor substrate (wafer). A mask pattern for one chip formed on an exposure mask substrate is reduced to ¼, for example, and exposed/ transferred onto each chip 332 by an exposure device (stepper, scanner, etc.) (not shown). The region of each chip 332 is divided into a plurality of stripe regions 32 by a predetermined width being in the y direction, for example. The scanning operation by the image acquisition mechanism 150 is carried out for each stripe region 32, for example. The stage 105 is moved, for example, in the –x direction, so that the scanning operation of the stripe region 32 is relatively advanced in the x direction. Each stripe region 32 is divided into a plurality of frame regions 33 in the longitudinal direction. Beam application to the frame region 33 concerned is achieved by collectively deflecting all the multiple beams 20 by the main deflector 208.

Figure 4:
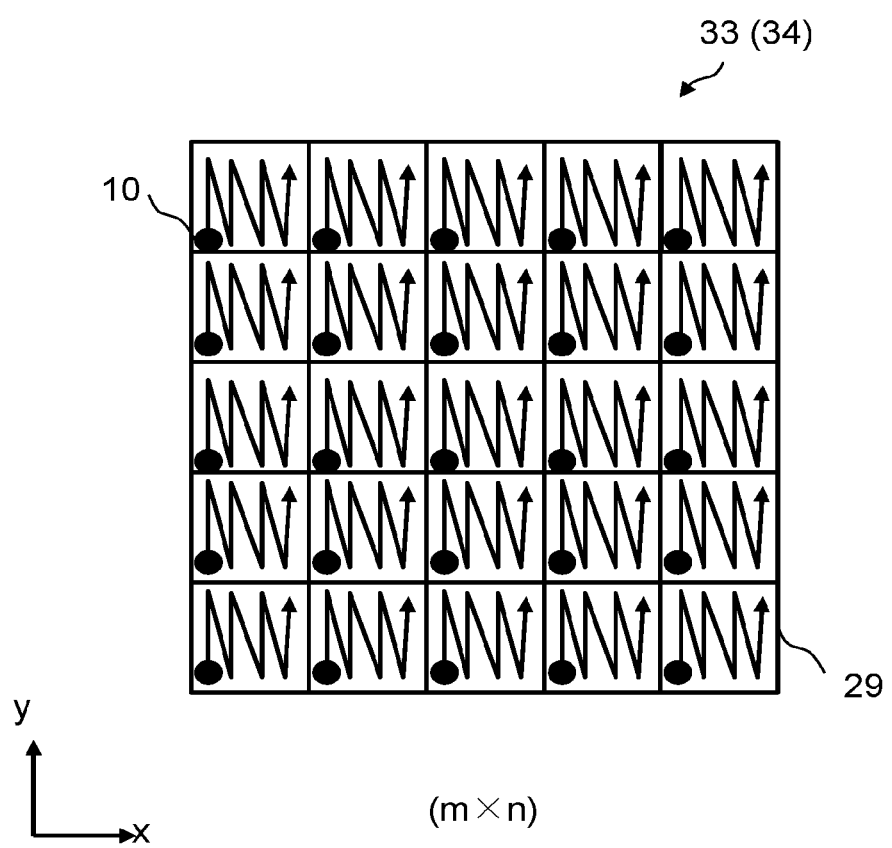
FIG. 4 illustrates a scanning operation with multiple beams according to the first embodiment.

FIG. 4 illustrates a scanning operation with multiple beams according to the first embodiment. FIG. 4 shows the case of multiple primary electron beams 20 of 5 rows×5 columns (5 rows by 5 columns). The size of an irradiation region 34 that can be irradiated by one irradiation with the multiple primary electron beams 20 is defined by (x direction size obtained by multiplying a pitch between beams in the x direction of the multiple primary electron beams 20 on the substrate 101 by the number of beams in the x direction)×(y direction size obtained by multiplying a pitch between beams in the y direction of the multiple primary electron beams 20 on the substrate 101 by the number of beams in the y direction). Preferably, the width of each stripe region 32 is set to be the same as the size in the y direction of the irradiation region 34, or to be the size reduced by the width of the scanning margin. In the case of FIGS. 3 and 4, the irradiation region 34 and the frame region 33 are of the same size. However, it is not limited thereto. The irradiation region 34 may be smaller than the frame region 33, or larger than it. Each beam of the multiple primary electron beams 20 scans a sub-irradiation region 29 concerned surrounded by the pitch between the beams in the x direction and the pitch between the beams in the y direction such that the beam concerned itself is located therein. Each primary electron beam 10 of the multiple primary electron beams 20 is associated with any one of the sub-irradiation regions 29 which are different from each other. At the time of each shot, each primary electron beam 10 is applied to the same position in the associated sub-irradiation region 29. The primary electron beam 10 is moved in the sub-irradiation region 29 by collective deflection of all the multiple primary electron beams 20 by the sub deflector 209. By repeating this operation, the inside of one sub-irradiation region 29 is irradiated, in order, with one primary electron beam 10. When scanning one sub-irradiation region 29 is completed, the irradiation position is moved to an adjacent frame region 33 in the same stripe region 32 by collectively deflecting all the multiple primary electron beams 20 by the main deflector 208. By repeating this operation, the inside of the stripe region 32 is irradiated in order. After scanning one stripe region 32 is completed, the irradiation position is moved to the next stripe region 32 by moving the stage 105 and/or by collectively deflecting all the multiple primary electron beams 20 by the main deflector 208. As described above, a secondary electron image of the frame region 33, a secondary electron image of the stripe region 32, or a secondary electron image of the chip 332 is configured by combining images (partial secondary electron images) of the sub-irradiation region 29 obtained by irradiation with each primary electron beam 10$i$.

It is also preferable to group, for example, a plurality of chips 332 arranged in the x direction as one group, and to divide each group into a plurality of stripe regions 32 by a predetermined width in the y direction, for example. Then, moving between the stripe regions may be performed not only for each chip 332 but also for each group.

In the case of the substrate 101 being irradiated with the multiple primary electron beams 20 while the stage 105 is continuously moving, the main deflector 208 executes a tracking operation by performing collective deflection so that the irradiation position of the multiple primary electron beams 20 may follow the movement of the stage 105. Therefore, the emission position of the multiple secondary electron beams 300 changes every second with respect to the trajectory central axis of the multiple primary electron beams 20. Similarly, in the case of scanning the sub-irradiation region 29, the emission position of each secondary electron beam changes every second inside the sub-irradiation region 29. Thus, the deflector 218 collectively deflects the multiple secondary electron beams 300 so that each secondary electron beam whose emission position has changed may be applied to a corresponding detection region of the multi-detector 222.

As described above, in the apparatus using the multiple primary electron beams 20, since a lot of primary electron beams 10 such as five hundred and twenty-nine beams are used, the frequency of defect occurrence in partial primary electron beams is stochastically high. If a defective beam is generated, an image to be inspected is no longer obtained, or even if obtained, since the image accuracy degrades, it becomes difficult to perform a sufficient inspection. For example, if a defective beam being "always Off" is generated, an inspection image (image to be inspected) cannot be obtained. For example, if a defective beam whose predetermined beam current amount cannot be obtained even though "beam On" control can be performed, since necessary secondary electrons are not emitted, the image accuracy degrades. Therefore, the first embodiment describes a configuration in which it is detected whether there is a defective beam, and even when a defective beam exits in the multiple primary electron beams 20, beam irradiation achieving desired accuracy can be performed.

Figure 5:
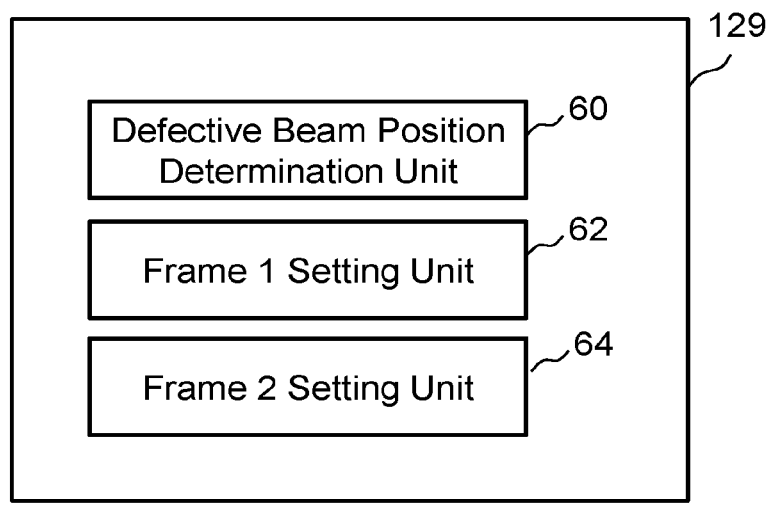
FIG. 5 is a block diagram showing an example of a configuration of a frame setting circuit according to the first embodiment.

FIG. 5 is a block diagram showing an example of a configuration of the frame setting circuit 129 according to the first embodiment. In FIG. 5, a defective beam position determination unit 60, a frame 1 setting unit 62, and a frame 2 setting unit 64 are arranged in the frame setting circuit 129. Each of the "units" such as the defective beam position determination unit 60, the frame 1 setting unit 62, and the frame 2 setting unit 64 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the defective beam position determination unit 60, the frame 1 setting unit 62, and the frame 2 setting unit 64, and calculated results are stored in a memory (not shown) or in the memory 118 each time.

Figure 6:
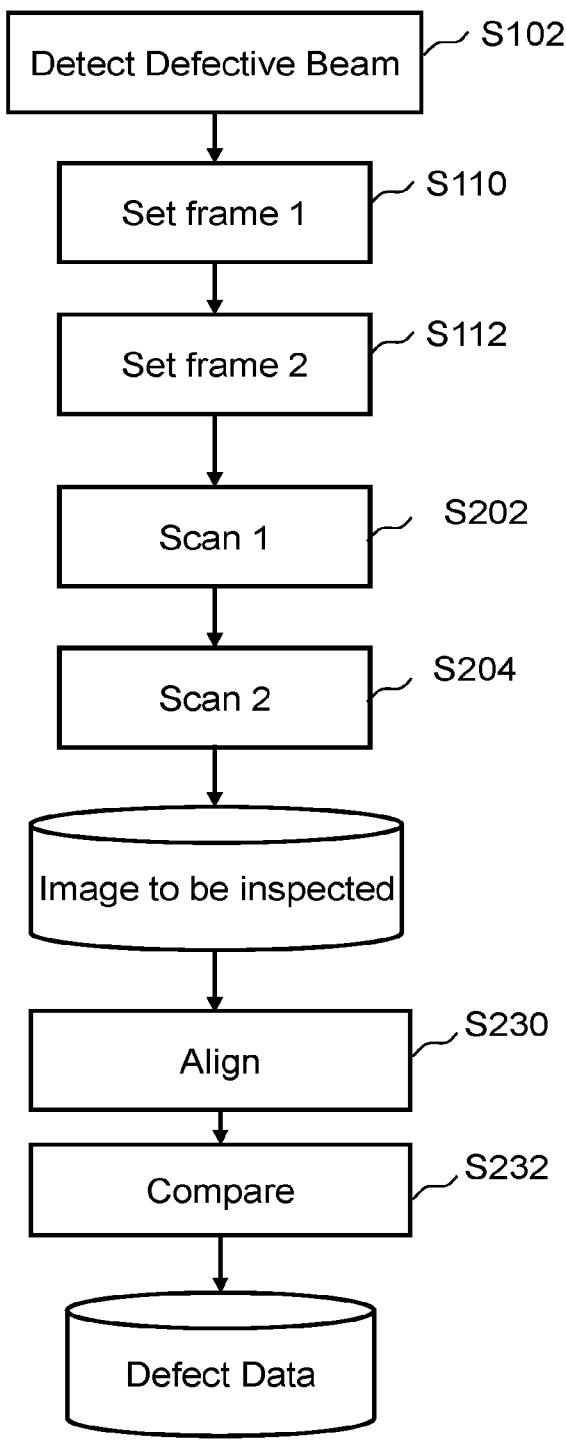
FIG. 6 is a flowchart showing main steps of an inspection method according to the first embodiment.

FIG. 6 is a flowchart showing main steps of an inspection method according to the first embodiment. In FIG. 6, the inspection method of the first embodiment executes a series of steps: a defective beam detecting step (S102), a frame 1 setting step (S110), a frame 2 setting step (S112), a scanning 1 step (S202), a scanning 2 step (S204), an alignment step (S230), and a comparison step (S232).

In the defective beam detecting step (S102), first, the image acquisition mechanism 150 scans the evaluation substrate, on which an evaluation pattern has been formed, with the multiple primary electron beams 20 of m rows×n columns (m rows by n columns, where m and n are integers of 3 or more), and acquires an evaluation pattern image of each sub-irradiation region 29 which is scanned by a corresponding primary electron beam 10i. As an evaluation pattern, for example, it is preferable to use a pattern where the same figure patterns are arranged at a predetermined pitch. For example, preferably, patterns arranged at the beam pitch of the multiple primary electron beams 20 are used. Then, the obtained measurement image data is transmitted to the frame setting circuit 129, together with information indicating each position from the position circuit 107.

Next, the defective beam detection circuit 130 individually mutually compares the evaluation pattern image of each sub-irradiation region 29 in order to detect a defective beam. Specifically, on the basis that the evaluation pattern images of the sub-irradiation regions 29 should be the same as each other, the defective beam detection circuit 130 detects a sub-irradiation region 29 whose evaluation pattern image is inconsistent with those of the other sub-irradiation regions 29. Further, the defective beam detection circuit 130 detects the primary electron beam 10i which irradiated the detected sub-irradiation region 29, and determines the position of the detected primary electron beam 10i. The amount of current emitted from a defective beam is different from those emitted from other normal primary electron beams 10. For example, if the defective beam is an "always Off" beam, the amount of current is zero, and therefore, basically and generally, no secondary electron is to be detected. When the amount of current is different from others, the evaluation pattern image obtained based on the different current amount is also different from other images greatly. Thus, it is possible to detect a defective beam by individually mutually comparing the evaluation pattern image of each sub-irradiation region 29, on the basis that they should be the same pattern images as each other. Information on the detected defective beam is output to the frame setting circuit 129. In the frame setting circuit 129, the defective beam position determination unit 60 determines the position of the detected defective beam. Thereby, in the case of setting a frame region as described below, the position of a defective beam can be specified.

Figure 7:
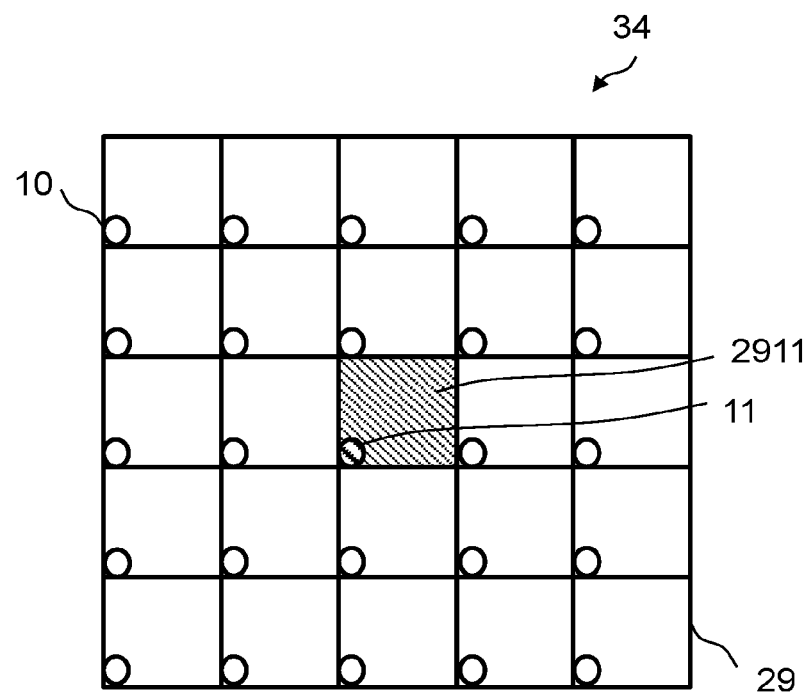
FIG. 7 shows an example of an irradiation region of multiple primary electron beams, and a sub-irradiation region to be irradiated by a defective beam, according to the first embodiment.
Figure 7:
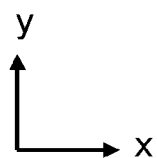

FIG. 7 shows an example of an irradiation region of multiple primary electron beams, and a sub-irradiation region to be irradiated by a defective beam, according to the first embodiment. FIG. 7 shows the case of the multiple primary electron beams 20 of 5 rows×5 columns, for example. Moreover, FIG. 7 shows the case of the center beam being a defective beam 11, for example. In such a case, compared with the image of the sub-irradiation region 29 scanned by each normal primary electron beam 10, the image of a sub-irradiation region 2911 scanned by the defective beam 11 is an image with degraded accuracy.

In the frame 1 setting step (S110), when one defective beam exists at the position other than the four corners of the multiple primary electron beams 20 of m rows×n columns (m and n are integers of 3 or more), the frame 1 setting unit 62 (example of the first region setting unit) sets a plurality of frame regions 33-1 (the first frame region) obtained by virtually dividing the chip 332 (beam irradiation target region) of the substrate 101 (target object) by the size of the irradiation region which can be irradiated with remaining beams of (m−1) rows by (n−1) columns obtained by excluding the beams in one row and one column at the end from the multiple primary electron beams 20. Here, the beams in one row and one column are excluded in a manner such that the defective beam 11 is included in the remaining beams.

Figure 8:
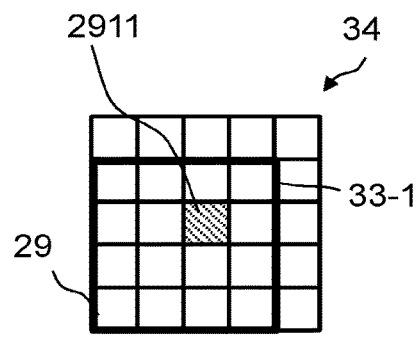
FIG. 8 shows an example of the size of a frame region used for the first scanning, according to the first embodiment.

FIG. 8 shows an example of the size of a frame region used for the first scanning, according to the first embodiment. FIG. 8 shows the case of the multiple primary electron beams 20 of 5 rows×5 columns, for example. The size of the sub-irradiation region 29 of 4 rows×4 columns irradiated by the multiple primary electron beams 20 of 4 rows×4 columns obtained by excluding the beams in one row and one column at the end is set as the size of the frame region 33-1. FIG. 8 shows the case of the sub-irradiation region 29 obtained by excluding the top row and the right end column. As shown in FIG. 4, the irradiation region 34 is composed of a plurality of the sub-irradiation regions 29.

Figure 9:
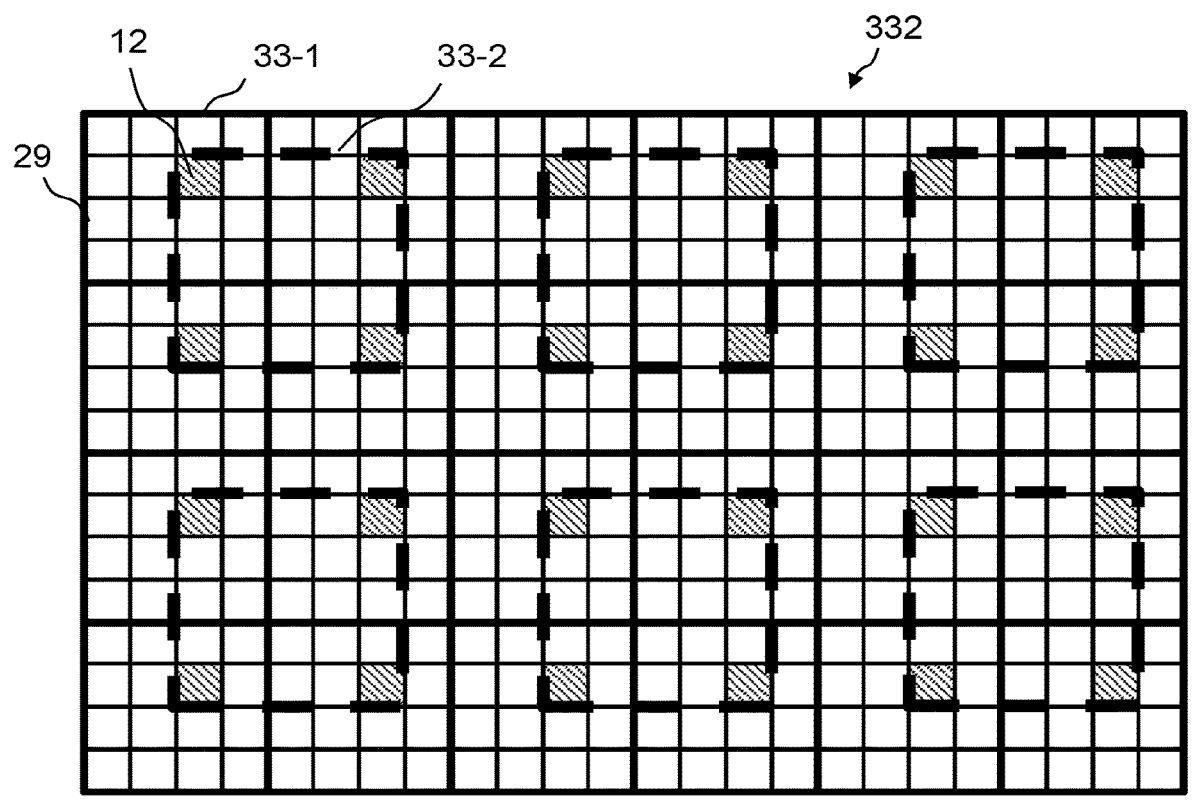
FIG. 9 shows an example of frame regions used for the first scanning and the second scanning according to the first embodiment.

FIG. 9 shows an example of frame regions used for the first scanning and the second scanning according to the first embodiment. For example, defining the lower left corner as a reference point, the frame 1 setting unit 62 divides the chip 332 region into a plurality of frame regions 33-1 each composed of the sub-irradiation regions 29 of 4 rows×4 columns which is to be irradiated with the multiple primary electron beams 20 of 4 rows×4 columns. As shown in FIG. 9, a plurality of frame regions 33-1 are set such that they contact with each other.

In the frame 2 setting step (S112), using at least normal beams in the remaining beams obtained by excluding the beams in one row and one column at the end of the multiple primary electron beams 20, the frame 2 setting unit 64 (example of the second region setting unit) sets a plurality of frame regions 33-2 (the second frame region) each of which has four corners of the sub-irradiation regions 2911 equivalent to the irradiation positions of the defective beam 11 when performing the first irradiation processing of the multiple primary electron beams 20 for each of a plurality of frame regions 33-1. When each frame region 33-1 is irradiated with remaining beams obtained by excluding the beams in one row and one column at the end, as shown in FIG. 9, a frame region 33-2 can be set in a manner such that the irradiation positions of the four corner beams of the multiple primary electron beams 20 of m rows×n columns overlap with all the irradiation positions of the defective beam 11. Furthermore, as shown in FIG. 9, a plurality of frame regions 33-2 are arranged not to contact with each other. In the example of FIG. 9, a plurality of frame regions 33-2 are set at intervals of three sub-irradiation regions 29, for example.

In the scanning 1 step (S202), using at least normal beams in the remaining beams obtained by excluding the beams in one row and one column at the end, the image acquisition mechanism 150 (example of an electron beam irradiation mechanism) performs the first irradiation processing of the multiple primary electron beams 20 for each of a plurality of frame regions 33-1 of the substrate 101. Specifically, it operates as follows: While moving the stage 105 at the constant speed V1, the image acquisition mechanism 150 irradiates the substrate 101, on which a plurality of figure patterns are formed, with the multiple primary electron beams 20, detects the multiple secondary electron beams 300 emitted from the substrate 101 due to the irradiation by the multiple primary electron beams 20, and acquires secondary electron images of a plurality of figure patterns. As described above, reflected electrons and secondary electrons may be projected on the multi-detector 222, or alternatively, after reflected electrons having been emitted along the way, only remaining secondary electrons may be projected thereon. Since the inspection apparatus 100 does not form (write) a pattern on the substrate 101, the substrate 101 may be irradiated with extra beams as long as there is no possibility of damaging the substrate 101 or interfering with other sub-irradiation regions 29. What is necessary is to be able to make a choice about detected intensity data of a secondary electron beam used for an inspection image. Therefore, there is no particular necessity of restricting the number of the multiple primary electron beams 20 to be applied to the substrate 101. In the case of FIG. 9, the multiple primary electron beams 20 of 5 rows×5 columns including the defective beam 11 may be used as they are for scanning. However, for each frame region 33-1, the image acquisition mechanism 150 aligns the position of the irradiation region of remaining beams obtained by excluding the beams in one row and one column at the end with the frame region 33-1 concerned so that the remaining beams can scan the frame region 33-1 concerned. Then, the image of each frame region 33-1 is acquired due to the irradiation by the remaining beams obtained by excluding the beams in one row and one column at the end.

As described above, for acquiring an image, the multiple primary electron beams 20 are applied to the substrate 101 so that the multi-detector 222 may detect the multiple secondary electron beams 300, including reflected electrons, emitted from the substrate 101 by the irradiation with the multiple primary electron beams 20. Detected data (measured image: secondary electron image: image to be inspected) on a secondary electron detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed in each frame region 33-1 by performing the first scanning processing. Then, the acquired measured image data is transmitted to the comparison circuit 108, together with information on each position from the position circuit 107.

In the scanning 2 step (S204), using at least the beams at the four corners of the multiple electron beams of m rows×n columns, the image acquisition mechanism 150 performs the second irradiation processing of the multiple primary electron beams for each of a plurality of frame regions 33-2 of the substrate 101. Specifically, it operates as follows: While moving the stage 105 at the constant speed V2, the image acquisition mechanism 150 irradiates the substrate 101, on which a plurality of figure patterns are formed, with the multiple primary electron beams 20, detects the multiple secondary electron beams 300 emitted from the substrate 101 due to the irradiation by the multiple primary electron beams 20, and acquires secondary electron images of a plurality of figure patterns. As described above, reflected electrons and secondary electrons may be projected on the multi-detector 222, or alternatively, after reflected electrons having been emitted along the way, only remaining secondary electrons may be projected thereon.

With respect to the first scanning step (scanning 1) (S202), no normal image has been acquired for the sub-irradiation region 2911 equivalent to the irradiation position of the defective beam 11. Therefore, in the second scanning step (scanning 2) (S204), it is necessary to acquire a normal image of at least the sub-irradiation region 2911 equivalent to the irradiation position of the defective beam 11. Therefore, it is sufficient to scan the sub-irradiation region 2911 equivalent to the irradiation position of the defective beam 11 by just the beams at the four corners of the multiple electron beams of m rows×n columns. Note, however, that, as described above, since the inspection apparatus 100 does not form (write) a pattern on the substrate 101, the substrate 101 may be irradiated with extra beams as long as there is no possibility of damaging the substrate 101 or interfering with other sub-irradiation regions 29. What is necessary is to be able to make a choice about detected intensity data of a secondary electron beam used for an inspection image. Therefore, there is no particular necessity of restricting the number of the multiple primary electron beams 20 to be applied to the substrate 101. In the case of FIG. 9, the multiple primary electron beams 20 of 5 rows×5 columns including the defective beam 11 may be used as they are for scanning. However, for each frame region 33-2, the image acquisition mechanism 150 aligns the position of the irradiation region 34 of the multiple primary electron beams 20 with the frame region 33-2 concerned so that the multiple primary electron beams 20 of m rows×n columns can scan the frame region 33-2 concerned. Then, the image of each frame region 33-2 is acquired due to the irradiation by the multiple primary electron beams 20 of m rows×n columns. Since the beams at the four corners of the multiple primary electron beams 20 are not the defective beams 11 but normal beams, the sub-irradiation region 2911 equivalent to the irradiation position of the defective beam 11 in the first scanning step (scanning 1) (S202) can be scanned by a normal beam in the second scanning step (scanning 2) (S204).

With respect to a plurality of frame regions 33-2, since they are set at intervals as shown in FIG. 9, the area of the whole region to be scanned can be smaller than the total area of a plurality of frame regions 33-1. In the case of FIG. 9, the area of the whole region to be scanned is reduced by the ratio obtained by dividing the area of one frame region 33-2 by the total area of four frame regions 33-1. Thus, the stage speed can be increased by the ratio of the area reduction. Therefore, the drive mechanism 142 of the stage 105 makes the moving speed of the stage 105 in the second scanning operation (scanning 2) (the second irradiation processing of multiple electron beams) faster than that in the first scanning operation (scanning 1) (the first irradiation processing of multiple electron beams). In other words, the speed V2 of the stage 105 in the second scanning (scanning 2) can be faster than the speed V1 of the stage 105 in the first scanning (scanning 1). Therefore, the scanning time (image acquisition time) of the second scanning (scanning 2) can be much reduced compared to that of the first scanning (scanning 1). Moreover, since the stripe regions 32 are set at intervals, the total number of the stripe regions 32 is reduced, and therefore, the scanning time (image acquisition time) is much reduced compared to that of the first scanning (scanning 1).

As described above, for acquiring an image, the multiple primary electron beams 20 are applied to the substrate so that the multi-detector 222 may detect the multiple secondary electron beams 300, including reflected electrons, emitted from the substrate 101 by irradiation with the multiple primary electron beams 20. Detected data (measured image: secondary electron image: image to be inspected) on a secondary electron detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed in each frame region 33-2 by performing the second scanning processing. Then, the acquired measured image data is transmitted to the comparison circuit 108, together with information on each position from the position circuit 107.

In the example described above, after setting the frame region 33-1 and the frame region 33-2, the first scanning step (scanning 1) (S202) and the second scanning step (scanning 2) (S204) are performed. However, it is not limited thereto. It is also preferable that after setting the frame region 33-1 and carrying out the first scanning step (scanning 1) (S202), the frame region 33-2 is set and then, the second scanning step (scanning 2) (S204) is performed. Alternatively, it is preferable that, in parallel to executing the first scanning step (scanning 1) (S202), the frame region 33-2 is set and then, the second scanning step (scanning 2) (S204) is performed. Moreover, the order between the scanning 1 step (S202) and the scanning 2 step (S204) in FIG. 6 may be reversed.

Figure 10:
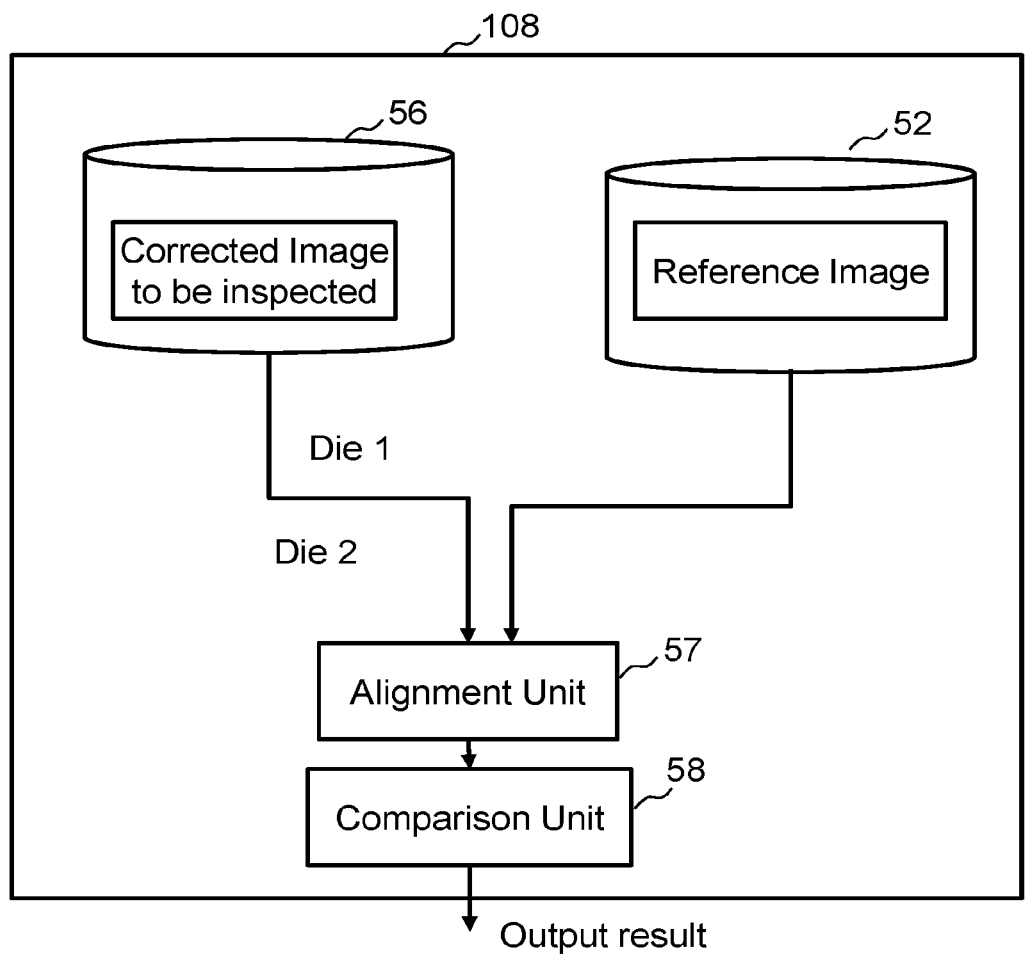
FIG. 10 shows an example of an internal configuration of a comparison circuit according to the first embodiment.

FIG. 10 shows an example of an internal configuration of a comparison circuit according to the first embodiment. In FIG. 10, storage devices 52 and 56, such as magnetic disk drives, an alignment unit 57, and a comparison unit 58 are arranged in the comparison circuit 108. Each of the "units" such as the alignment unit 57 and the comparison unit 58 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the alignment unit 57 and the comparison unit 58, and calculated results are stored in a memory (not shown) or in the memory 118 each time.

The comparison circuit 108 (inspection unit) performs inspection of measured images (partial secondary electron images) of a plurality of sub-irradiation regions 29 of each frame region 33. Here, the case of performing a die-to-die inspection will be mainly described.

According to the first embodiment, the sub-irradiation region 29 acquired by scanning operation of one primary electron beam 10*i* is further divided into a plurality of mask die regions. The mask die region is used as a unit region of an image to be inspected. In order to prevent missing an image, it is preferable that the margin region of each mask die region overlaps each other.

In the comparison circuit 108, transmitted pattern image data (secondary electron image data) is temporarily stored in the storage device 56, as a mask die image (corrected image to be inspected) of each mask die region. Although measured images of the same sub-irradiation region 29 are obtained overlappingly by performing the second scanning step (scanning 2) (S204), it is sufficient, in the inspection below, to inspect one of them (excluding the measured image of the sub-irradiation region 2911 equivalent to the irradiation position of the defective beam 11). Needless to say, both of them may be inspected.

In the alignment step (S230), the alignment unit 57 reads a mask die image (corrected image to be inspected) of the die 1 and a mask die image (corrected image to be inspected) of the die 2 on which the same pattern as that of the die 1 is formed, and provides alignment between both the images, based on units of sub-pixels smaller than units of pixels. For example, the alignment can be performed using a least-squares method. Preferably, the pixel size is set to be, for example, a region being approximately the same as each beam size of the multiple primary electron beams 20. Therefore, the sub-irradiation region 29 to be scanned by each beam is composed of N×N pixels. For example, it is composed of 1024×1024 pixels.

In the comparison step (S232), the comparison unit 58 compares the mask die image (corrected image to be inspected) of the die 1 with the mask die image (corrected image to be inspected) of the die 2. The comparison unit 58 compares them, for each pixel, based on predetermined determination conditions in order to determine whether there is a defect such as a shape defect. For example, if a gray scale level difference of each pixel is larger than a determination threshold Th, it is determined that there is a defect. Then, the comparison result is output, and specifically, output to the storage device 109, the monitor 117, or the memory 118.

In the example described above, the die-to-die inspection is performed. However, it is not limited thereto. The die-to-database inspection may be performed. When executing the die-to-database inspection, reference image data is temporarily stored in the storage device 52. A reference image is generated by the reference image generation circuit 112.

The reference image generation circuit 112 (reference image generation unit) generates a reference image corresponding to a mask die image, based on design data serving as a basis of a plurality of figure patterns formed on the substrate 101. Specifically, it operates as follows: First, design pattern data is read from the storage device 109 through the control computer 110, and each figure pattern defined in the read design pattern data is converted into image data of binary or multiple values.

As described above, basics of figures defined by the design pattern data are, for example, rectangles and triangles. For example, there is stored figure data defining the shape, size, position, and the like of each pattern figure by using information, such as coordinates (x, y) of the reference position of the figure, lengths of sides of the figure, and a figure code serving as an identifier for identifying the figure type such as rectangles, triangles and the like.

When design pattern data serving as the figure data is input to the reference image generation circuit 112, the data is developed into data of each figure. Then, the figure code indicating the figure shape, the figure dimensions, and the like of each figure data are interpreted. Then, the reference image generation circuit 112 develops each figure data to design pattern image data of binary or multiple values as a pattern to be arranged in a square in units of grids of predetermined quantization dimensions, and outputs the developed data. In other words, the reference image generation circuit 112 reads design data, calculates an occupancy rate occupied by a figure in the design pattern, for each square region obtained by virtually dividing the inspection region into squares in units of predetermined dimensions, and outputs n-bit occupancy rate data. For example, it is preferable to set one square as one pixel. Assuming that one pixel has a resolution of $1/2^8 (=1/256)$, the occupancy rate in each pixel is calculated by allocating small regions which correspond to the region of figures arranged in the pixel concerned and each of which corresponds to $1/256$ resolution. Therefore, the occupancy rate data is 8 bits. The square region (inspection pixel) should be in accordance with the pixel of measured data.

Next, the reference image generation circuit 112 performs filter processing on design image data of a design pattern which is image data of a figure, using a filter function F to which a calculated coefficient has been applied. Thereby, it is possible to match/fit the design image data being image data on the design side, whose image intensity (gray scale level) is represented by digital values, with image generation characteristics obtained by irradiation with a representative beam (e.g., center beam) of the multiple primary electron beams 20. The generated image data of a reference image is output to the comparison circuit 108.

In the alignment step (S230), the alignment unit 57 reads a mask die image serving as an image to be inspected and a reference image corresponding to the mask die image, and provides alignment between both the images, based on units of sub-pixels smaller than units of pixels. For example, the alignment can be performed using a least-squares method. Preferably, the pixel size is set to be, for example, a region being approximately the same as each beam size of the multiple primary electron beams 20. Therefore, the sub-irradiation region 29 to be scanned by each beam is composed of N×N pixels. For example, it is composed of 1024×1024 pixels.

In the comparison step (S232), the comparison unit 58 compares the mask die image (secondary electron image) with the reference image. The comparison unit 58 compares them, for each pixel, based on predetermined determination conditions in order to determine whether there is a defect such as a shape defect. For example, if a gray scale level difference of each pixel is larger than the determination threshold Th, it is determined that there is a defect. Then, the comparison result is output, and specifically, output to the storage device 109, the monitor 117, or the memory 118.

As described above, according to the first embodiment, even when a defective beam exists in multiple electron beams, beam irradiation achieving desired accuracy can be performed. Furthermore, according to the first embodiment, it is possible to reduce a scanning time even when a scanning operation is performed twice in order to obtain an image of the region which is supposed to be irradiated with a defective beam. In other words, according to the first embodiment, even when a defective beam exists in multiple electron beams, beam irradiation reducing irradiation processing time can be executed.

Second Embodiment

Although the first embodiment describes the configuration of an irradiation method in the case where one defective beam exists at a position other than the four corners of multiple electron beams (multiple primary electron beams), a second embodiment herein describes the configuration of an irradiation method in the case a plurality of defective beams exist. The configuration of the inspection apparatus 100 according to the second embodiment may be the same as that of FIG. 1. The contents of the second embodiment are the same as those of the first embodiment except what is particularly described below.

Figure 11:
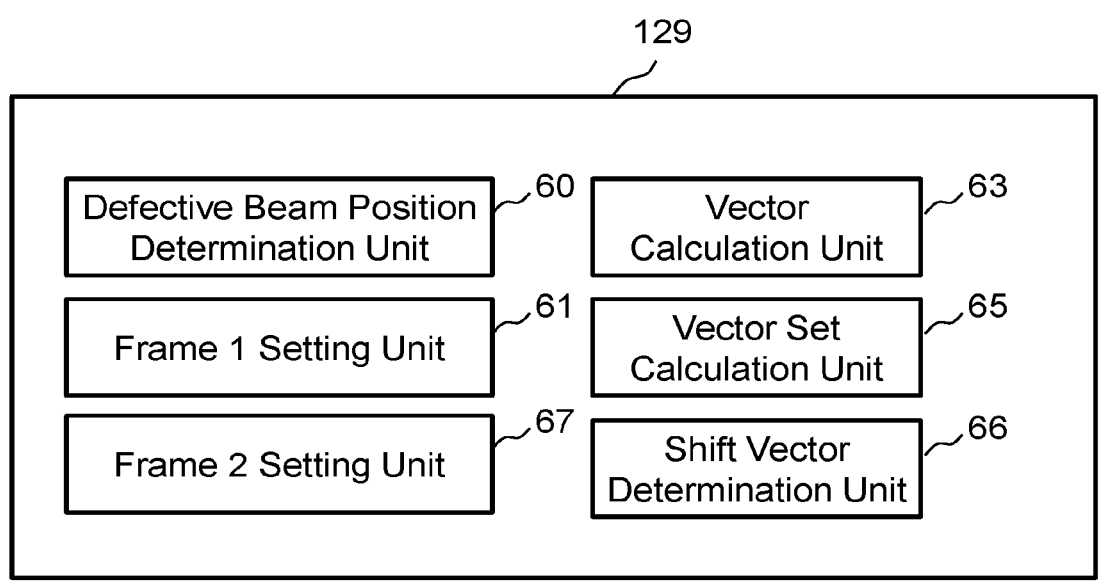
FIG. 11 is a block diagram showing an example of a configuration of a frame setting circuit according to a second embodiment.

FIG. 11 is a block diagram showing an example of a configuration of a frame setting circuit according to the second embodiment. FIG. 11 is the same as FIG. 5 except that a frame 1 setting unit 61, a vector calculation unit 63, a vector set calculation unit 65, a shift vector determination unit 66, and a frame 2 setting unit 67 are arranged in the frame setting circuit 129 instead that the frame 1 setting unit 62 and the frame 2 setting unit 64 are arranged therein in FIG. 5. Each of the "units" such as the defective beam position determination unit 60, the frame 1 setting unit 61, the vector calculation unit 63, the vector set calculation unit 65, the shift vector determination unit 66, and the frame 2 setting unit 67 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the defective beam position determination unit 60, the frame 1 setting unit 61, the vector calculation unit 63, the vector set calculation unit 65, the shift vector determination unit 66 and the frame 2 setting unit 67, and calculated results are stored in a memory (not shown) or in the memory 118 each time.

Figure 12:
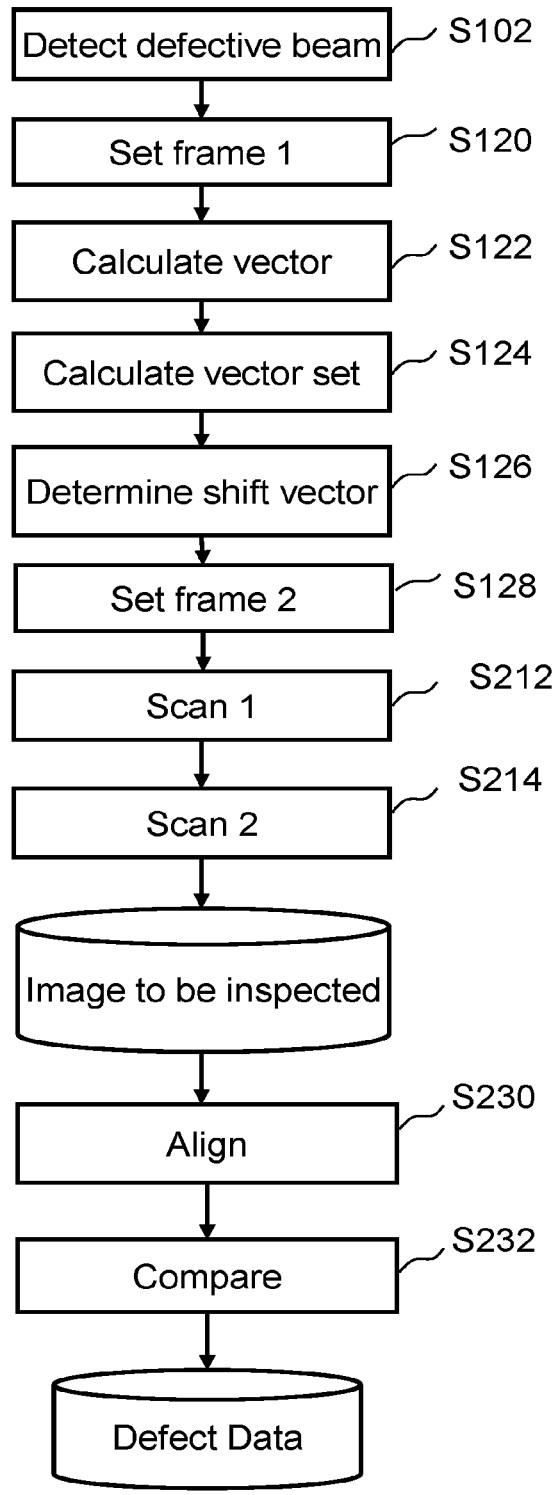
FIG. 12 is a flowchart showing main steps of an inspection method according to the second embodiment.

FIG. 12 is a flowchart showing main steps of an inspection method according to the second embodiment. In FIG. 12, the inspection method of the second embodiment executes a series of steps: the defective beam detecting step (S102), a frame 1 setting step (S120), a vector calculation step (S122), a vector set calculation step (S124), a shift vector determination step (S126), a frame 2 setting step (S128), a scanning 1 step (S212), a scanning 2 step (S214), an alignment step (S230), and a comparison step (S232).

The contents of the defective beam detecting step (S102) are the same as those of the first embodiment. However, the number of defective beams to be detected in the second embodiment differs from that of the first embodiment.

Figure 13:
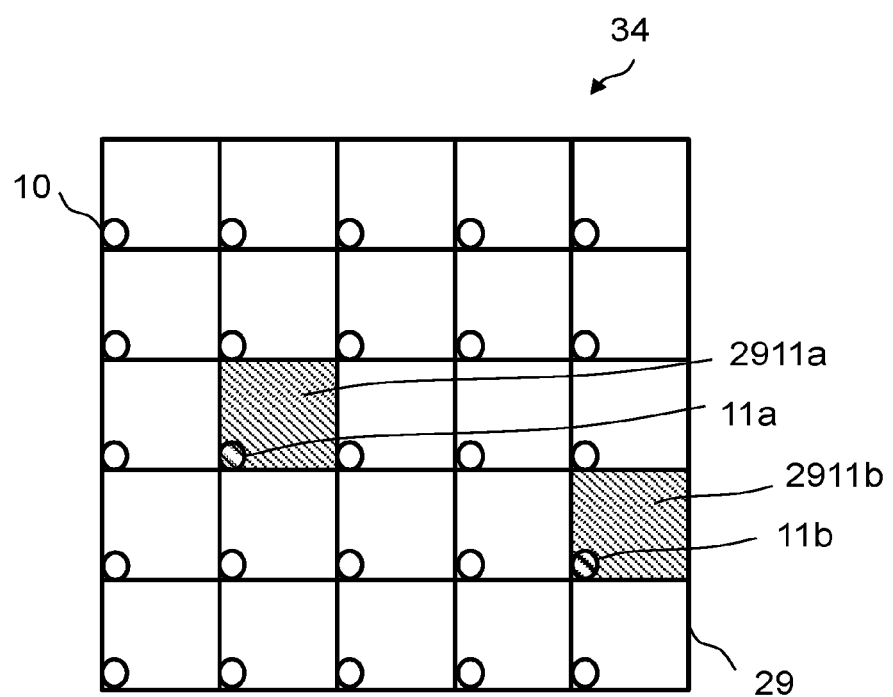
FIG. 13 shows an example of an irradiation region of multiple primary electron beams, and an irradiation region to be irradiated by a defective beam, according to the second embodiment.
Figure 13:
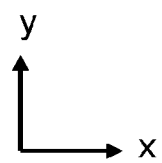

FIG. 13 shows an example of an irradiation region of multiple primary electron beams, and an irradiation region to be irradiated by a defective beam, according to the second embodiment. FIG. 13 shows the case of the multiple primary electron beams 20 of 5 rows×5 columns, for example. Regarding the lower left corner as a reference point, FIG. 13 shows the case where a plurality (two) of defective beams are detected; for example, a defective beam 11a at the second column in the x direction and the third row in the y direction, and a defective beam 11b at the fifth column in the x direction and the second row in the y direction. In such a case, compared with the image of the sub-irradiation region 29 scanned by each normal primary electron beam 10, the image of a sub-irradiation region 2911a scanned by the defective beam 11a and the image of a sub-irradiation region 2911b scanned by the defective beam 11b are images with degraded accuracy.

In the frame 1 setting step (S120), the frame 1 setting unit 61 (another example of the first region setting unit) sets a plurality of frame regions 33-1 (the first frame region) by virtually dividing the chip 332 (beam irradiation target region) of the substrate 101 by the size of the irradiation region 34 to be irradiated with the multiple primary electron beams 20 of m rows×n columns (m and n are integers of 3 or more).

Figure 14:
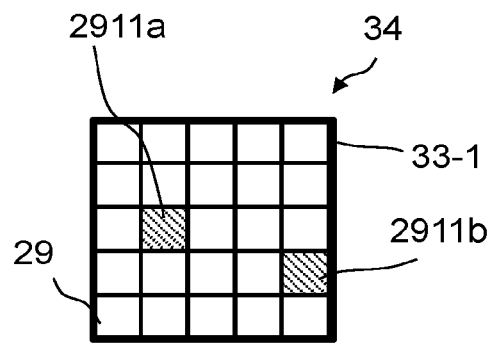
FIG. 14 shows an example of the size of a frame region used for the first scanning according to the second embodiment.

FIG. 14 shows an example of the size of a frame region used for the first scanning according to the second embodiment. FIG. 14 shows the case of the multiple primary electron beams 20 of 5 rows×5 columns, for example. In the second embodiment, the size of the sub-irradiation region 29 of 5 rows×5 columns to be irradiated by the original multiple primary electron beams 20 of 5 rows×5 columns is set as the size of the frame region 33-1.

Figure 15:
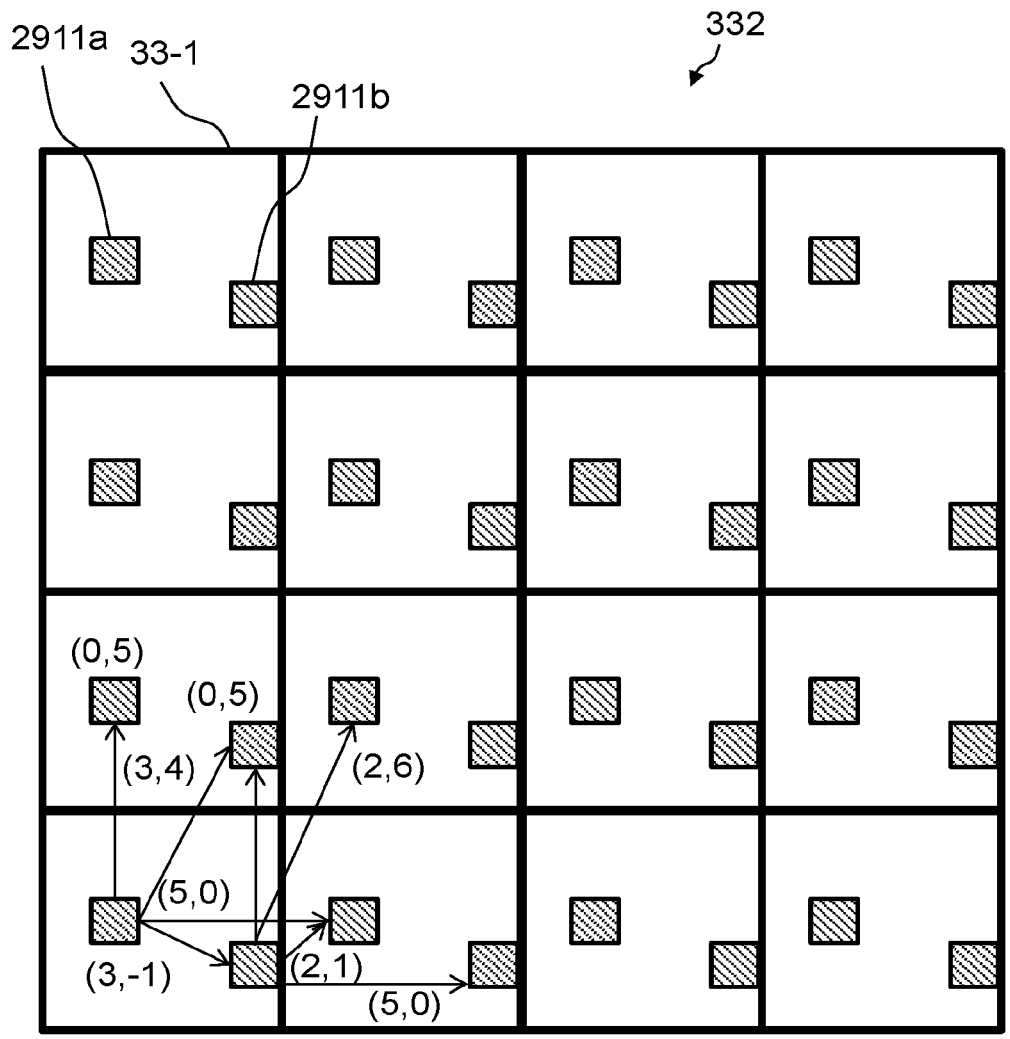
FIG. 15 shows an example of a frame region used for the first scanning according to the second embodiment.

FIG. 15 shows an example of a frame region used for the first scanning according to the second embodiment. For example, defining the lower left corner as a reference point, the frame 1 setting unit 61 divides the chip 332 region into a plurality of frame regions 33-1 by the size of the sub-irradiation region 29 of 5 rows×5 columns which is to be irradiated with the multiple primary electron beams 20 of 5 rows×5 columns. As shown in FIG. 15, a plurality of frame regions 33-1 are set such that they contact with each other.

In the vector calculation step (S122), in the case where the multiple primary electron beams 20 of m rows×n columns includes a plurality of defective beams 11a and 11b, and the first irradiation processing of the multiple electron beams is performed for each of a plurality of frame regions 33-1 by at least normal beams of the multiple electron beams of m rows×n columns, the vector calculation unit 63 calculates a vector between the regions of a plurality of sub-irradiation regions 2911a and 2911b which are equivalent to the irradiation positions of a plurality of defective beams 11a and 11b. The vector calculation unit 63 also calculates a vector for the adjacent frame region 33-1. In the example of FIG. 15, for example, when viewed from the defective sub-irradiation region 2911a in the lower left frame region 33-1, the vector to the defective sub-irradiation region 2911b in the same frame region 33-1 is (3, −1). When viewed from the defective sub-irradiation region 2911a in the lower left frame region 33-1, the vector to the defective sub-irradiation region 2911b in the adjacent frame region 33-1 being adjacent in the y direction is (3, 4). When viewed from the defective sub-irradiation region 2911b in the lower left frame region 33-1, the vector to the defective sub-irradiation region 2911a in the adjacent frame region 33-1 being adjacent in the x direction is (2, 1). In the example of FIG. 15, the index of the sub-irradiation regions 29 two-dimensionally arrayed is used as the unit of the position of the vector coordinates.

With respect to adjacent frame regions 33-1, although other vector(s) between the defective sub-irradiation regions 29 may exist, it is not necessary to calculate the vector whose x value is equal to or greater than the interval m between beam indexes in the x direction of the multiple primary electron beams 20, and y value is equal to or greater than the interval n between beam indexes in the y direction. In the example of FIG. 15, the following vectors are also shown as references of the vector whose x value is equal to or greater than the interval m between beam indexes in the x direction, and y value is equal to or greater than the interval n between beam indexes in the y direction. For example, when viewed from the defective sub-irradiation region 2911a in the lower left frame region 33-1, the vector to the defective sub-irradiation region 2911a in the adjacent frame region 33-1 being adjacent in the y direction is (0, 5). When viewed from the defective sub-irradiation region 2911a in the lower left frame region 33-1, the vector to the defective sub-irradiation region 2911a in the adjacent frame region 33-1 being adjacent in the x direction is (5, 0). When viewed from the defective sub-irradiation region 2911b in the lower left frame region 33-1, the vector to the defective sub-irradiation region 2911b in the adjacent frame region 33-1 being adjacent in the x direction is (5, 0). When viewed from the defective sub-irradiation region 2911b in the lower left frame region 33-1, the vector to the defective sub-irradiation region 2911b in the adjacent frame region 33-1 being adjacent in the y direction is (0, 5). When viewed from the defective sub-irradiation region 2911b in the lower left frame region 33-1, the vector to the defective sub-irradiation region 2911a in the adjacent frame region 33-1 being adjacent in the diagonal direction (x and y directions) is (2, 6).

In the vector set calculation step (S124), the vector set calculation unit 65 calculates a set of calculated vectors.

FIG. 16 shows an example of a vector set according to the second embodiment. Regarding the vectors described above, for example, a set A of vectors whose coordinate value is up to six is {(0, 5) (2, 1) (2, 6) (3, −1) (3, 4) (5, 0) (0, −5) (−2, −1) (−2, −6) (−3, 1) (−3, −4) (−5, 0)}. As described above, it is not necessary to calculate a vector whose x value is equal to or greater than m being the number of beams in the x direction of the multiple primary electron beams 20, and y value is equal to or greater than n being the number of beams in the y direction of the multiple primary electron beams 20. Therefore, the vector set calculation unit 65 calculates a set A' of vectors whose absolute value of the x value is less than the interval m between beam indexes in the x direction of the multiple primary electron beams 20, and absolute value of the y value is less than the interval n between beam indexes in the y direction. In the example of FIG. 16, the vector set A' is {(2, 1)(3, −1)(3, 4) (−2, −1)(−3, 1)(−3, −4)}.

In the shift vector determination step (S126), the shift vector determination unit 66 determines a shift vector by selecting, similarly to the case of calculating the vector set A', one vector in one or more vectors whose x value is less than the interval m between beam indexes in the x direction of the multiple primary electron beams 20 and y value is less than the interval n between beam indexes in the y direction, excluding the vectors belonging to the calculated set A' of vectors between the sub-irradiation regions 29 (region). In the case of FIG. 16, for example, the vector (1, 3) which does not belong to the vector set A' {(2, 1) (3, −1) (3, 4) (−2, −1) (−3, 1) (−3, −4)} is determined as a shift vector. Alternatively, instead of the vector (1, 3), the vector (1, 1) may be determined as a shift vector, for example. Alternatively, (1, 2) or (1, 4) may be determined as a shift vector. For example, with respect to the multiple primary electron beams 20 of 5 rows×5 columns, a vector can be selected and determined as a shift vector by excluding the vector (0, 0) and each coordinate of the vector set A' {(2, 1) (3, −1) (3, 4) (−2, −1) (−3, 1) (−3, −4)} from vectors whose x value is from −4 to 4 and y value is −4 to 4.

In the frame 2 setting step (S128), the frame 2 setting unit 67 (another example of the second region setting unit) sets a plurality of frame regions 33-2 (the second frame region) by shifting a plurality of frame regions 33-1 to vectors which do not belong to the vector set A' which is a set of calculated vectors between the defective sub-irradiation regions 2911a and 2911b (region).

Figure 17:
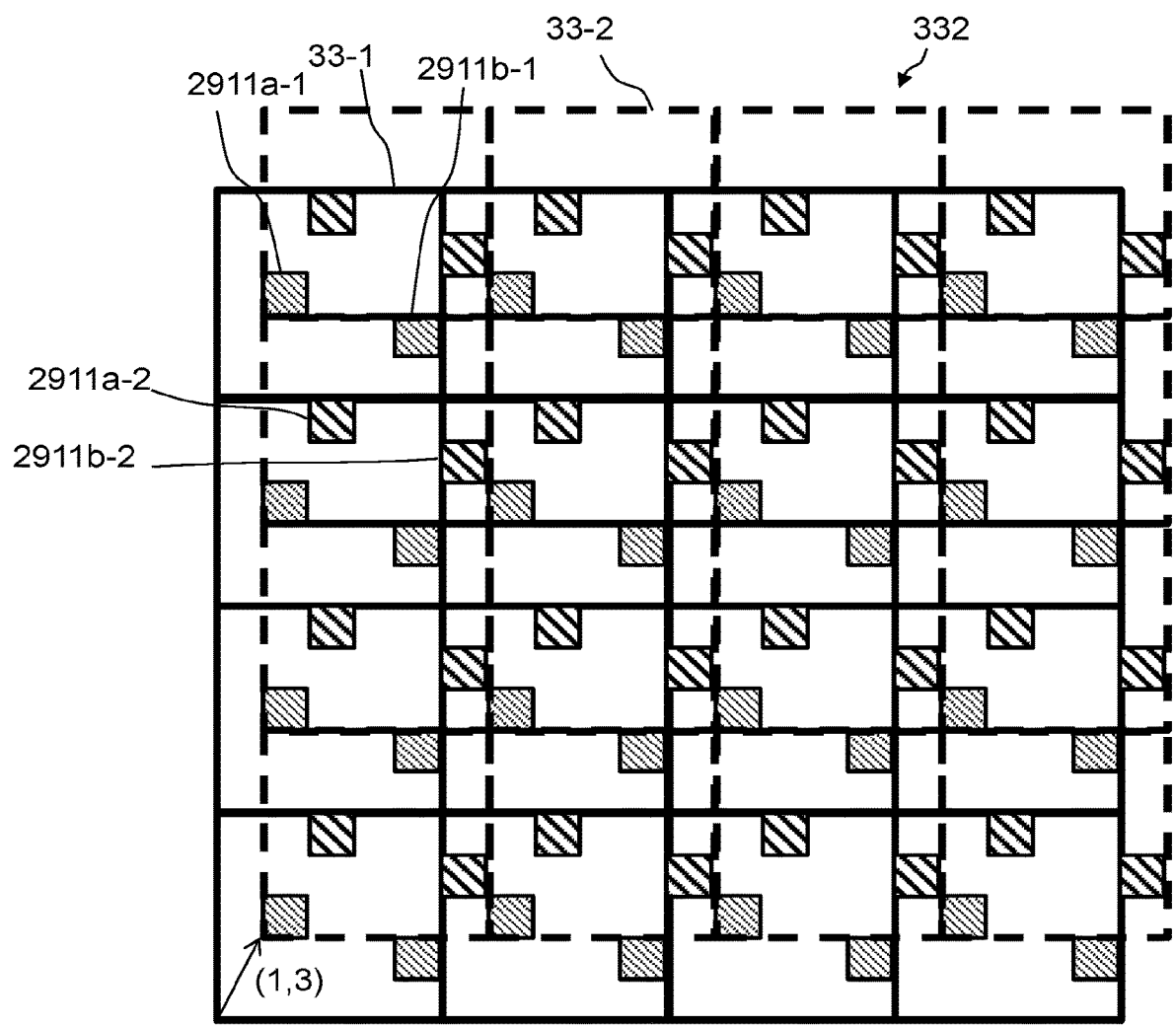
FIG. 17 shows an example of a frame region used for the first scanning, and an example of a frame region used for the second scanning according to the second embodiment.

FIG. 17 shows an example of a frame region used for the first scanning, and an example of a frame region used for the second scanning according to the second embodiment. For example, the frame 2 setting unit 67 sets a plurality of frame regions 33-2 to be used for the second scanning, by shifting a plurality of frame regions 33-1 to be used for the first scanning by the amount of the shift vector (1, 3), while defining the lower left corner as a reference point. As shown in FIG. 17, by setting a plurality of frame regions 33-2 used for the second scanning by performing shifting by the amount of a vector which does not belong to the vector set A' between the defective sub-irradiation regions 29, it becomes possible to shift, through the first scanning, the sub-irradiation regions 2911a-1 and 2911b-1 to be irradiated with a plurality of defective beams 11a and 11b, and to shift, through the second scanning, the sub-irradiation regions 2911a-2 and 2911b-2 to be irradiated with a plurality of defective beams 11a and 11b.

In the scanning 1 step (S212), using at least normal beams in the multiple primary electron beams 20 of m rows×n columns, the image acquisition mechanism 150 performs the first irradiation processing of the multiple primary electron beams 20 for each of a plurality of frame regions 33-1, according to the second embodiment. Specifically, it operates as follows: While moving the stage 105 at the constant speed V3, the image acquisition mechanism 150 irradiates the substrate 101, on which a plurality of figure patterns are formed, with the multiple primary electron beams 20, detects the multiple secondary electron beams 300 emitted from the substrate 101 due to the irradiation by the multiple primary electron beams 20, and acquires secondary electron images of a plurality of figure patterns. As described above, reflected electrons and secondary electrons may be projected on the multi-detector 222, or alternatively, after reflected electrons having been emitted along the way, only remaining secondary electrons may be projected thereon. Similarly to the first embodiment, since the inspection apparatus 100 does not form (write) a pattern on the substrate 101, the substrate 101 may be irradiated with extra beams as long as there is no possibility of damaging the substrate 101 or interfering with other sub-irradiation regions 29. What is necessary is to be able to make a choice about detected intensity data of a secondary electron beam used for an inspection image. Therefore, there is no particular necessity of restricting the number of the multiple primary electron beams 20 to be applied to the substrate 101. In the case of FIG. 17, the multiple primary electron beams 20 of 5 rows×5 columns including the defective beam 11 may be used as they are for scanning.

As described above, for acquiring an image, the multiple primary electron beams 20 are applied to the substrate 101 so that the multi-detector 222 may detect the multiple secondary electron beams 300, including reflected electrons, emitted from the substrate 101 by the irradiation with the multiple primary electron beams 20. Detected data (measured image: secondary electron image: image to be inspected) on a secondary electron detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed in each frame region 33-1 by performing the first scanning processing. Then, the acquired measured image data is transmitted to the comparison circuit 108, together with information on each position from the position circuit 107.

In the scanning 2 step (S214), the image acquisition mechanism 150 performs the second irradiation processing of the multiple electron beams for each of a plurality of frame regions 33-2, using at least normal beams which irradiate the irradiation positions of a plurality of defective beam 11 in a plurality of frame regions 33-2 of the multiple primary electron beams 20 of m rows×n columns according to the second embodiment. Specifically, it operates as follows: While moving the stage 105 at the constant speed V3, the image acquisition mechanism 150 irradiates the substrate 101, on which a plurality of figure patterns are formed, with the multiple primary electron beams 20, detects the multiple secondary electron beams 300 emitted from the substrate 101 due to the irradiation by the multiple primary electron beams 20, and acquires secondary electron images of a plurality of figure patterns. As described above, reflected electrons and secondary electrons may be projected on the multi-detector 222, or alternatively, after reflected electrons having been emitted along the way, only remaining secondary electrons may be projected thereon.

With respect to the first scanning step (scanning 1) (S202), no normal images have been acquired for the sub-irradiation regions 2911a-1 and 2911b-1 which are equivalent to the irradiation positions of a plurality of defective beams 11a and 11b. Thus, in the second scanning step (scanning 2) (S204), it is needed to acquire normal images of at least the sub-irradiation regions 2911-a and 2911-b equivalent to the irradiation positions of a plurality of the defective beams 11a and 11b. Therefore, it is sufficient to calculate and acquire normal beams for irradiating the sub-irradiation regions 2911a-1 and 2911b-1, and to scan, only with the acquired normal beams, the sub-irradiation regions 2911a-1 and 2911b-1 equivalent to the irradiation positions of a plurality of the defective beams 11a and 11b. Note, however, that, as described above, since the inspection apparatus 100 does not form (write) a pattern on the substrate 101, the substrate 101 may be irradiated with extra beams as long as there is no possibility of damaging the substrate 101 or interfering with other sub-irradiation regions 29. What is necessary is to be able to make a choice about detected intensity data of a secondary electron beam used for an inspection image. Therefore, there is no particular necessity of restricting the number of the multiple primary electron beams 20 to be applied to the substrate 101. In the case of FIG. 17, the multiple primary electron beams 20 of 5 rows×5 columns including a plurality of the defective beams 11a and 11b may be used as they are for scanning. According to the second embodiment, not by arbitrarily shifting the frame region for the second scanning (scanning 2), but by shifting the setting position of the frame region 33-2 for the second scanning to the vector which does not belong to the vector set A' being a set of vectors between the defective sub-irradiation region 2911a and 2911b, it becomes possible in the second scanning step (scanning 2) (S214) to certainly scan with normal beams the sub-irradiation regions 2911a-1 and 2911b-1 equivalent to the irradiation positions of a plurality of defective beams 11a and 11b of the first scanning step (scanning 1) (S212).

As described above, for acquiring an image, the multiple primary electron beams 20 are applied to the substrate 101 so that the multi-detector 222 may detect the multiple secondary electron beams 300, including reflected electrons, emitted from the substrate 101 by the irradiation with the multiple primary electron beams 20. Detected data (measured image: secondary electron image: image to be inspected) on a secondary electron detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed in each frame region 33-2 by performing the second scanning processing. Then, the acquired measured image data is transmitted to the comparison circuit 108, together with information on each position from the position circuit 107.

The comparison circuit 108 (inspection unit) inspects the acquired secondary electron image. The contents of each of the alignment step (S230) and the comparison step (S232) which perform inspection processing are the same as those of the first embodiment.

As described above, according to the second embodiment, even when a defective beam exists in multiple electron beams, beam irradiation achieving desired accuracy can be performed. Furthermore, according to the second embodiment, when a scanning operation is performed twice in order to obtain images of a plurality of regions which are supposed to be irradiated with a plurality of defective beams, images can be acquired certainly with normal beams through the second scanning step with with respect to the sub-irradiation regions having been irradiated by defective beams in the first scanning.

Third Embodiment

Regarding an irradiation method in the case of there being a defective beam, a third embodiment describes a configuration by which all necessary images can be acquired through one scanning operation performed more simply than that in each Embodiment described above. The configuration of the inspection apparatus 100 according to the third embodiment may be the same as that of FIG. 1. The contents of the third embodiment are the same as those of the first embodiment except what is particularly described below.

Figure 18:
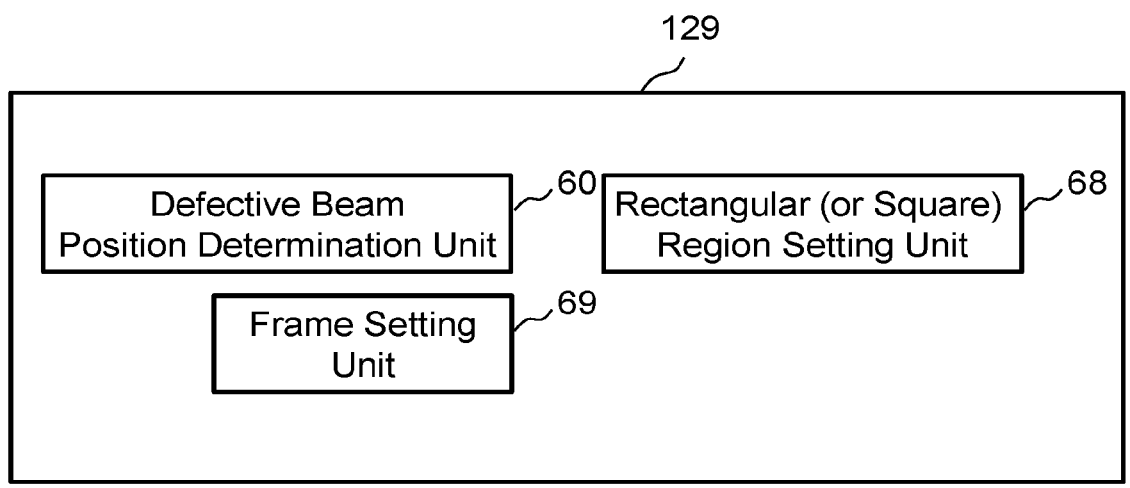
FIG. 18 is a block diagram showing an example of a configuration of a frame setting circuit according to a third embodiment.

FIG. 18 is a block diagram showing an example of a configuration of a frame setting circuit according to the third embodiment. FIG. 18 is the same as FIG. 5 except that a rectangular (or "square") region setting unit 68 and a frame setting unit 69 are arranged in the frame setting circuit 129 instead that the frame 1 setting unit 62 and the frame 2 setting unit 64 are arranged therein in FIG. 5. Each of the "units" such as the defective beam position determination unit 60, the rectangular region setting unit 68, and the frame setting unit 69 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the defective beam position determination unit 60, the rectangular region setting unit 68, and the frame setting unit 69, and calculated results are stored in a memory (not shown) or in the memory 118 each time.

Figure 19:
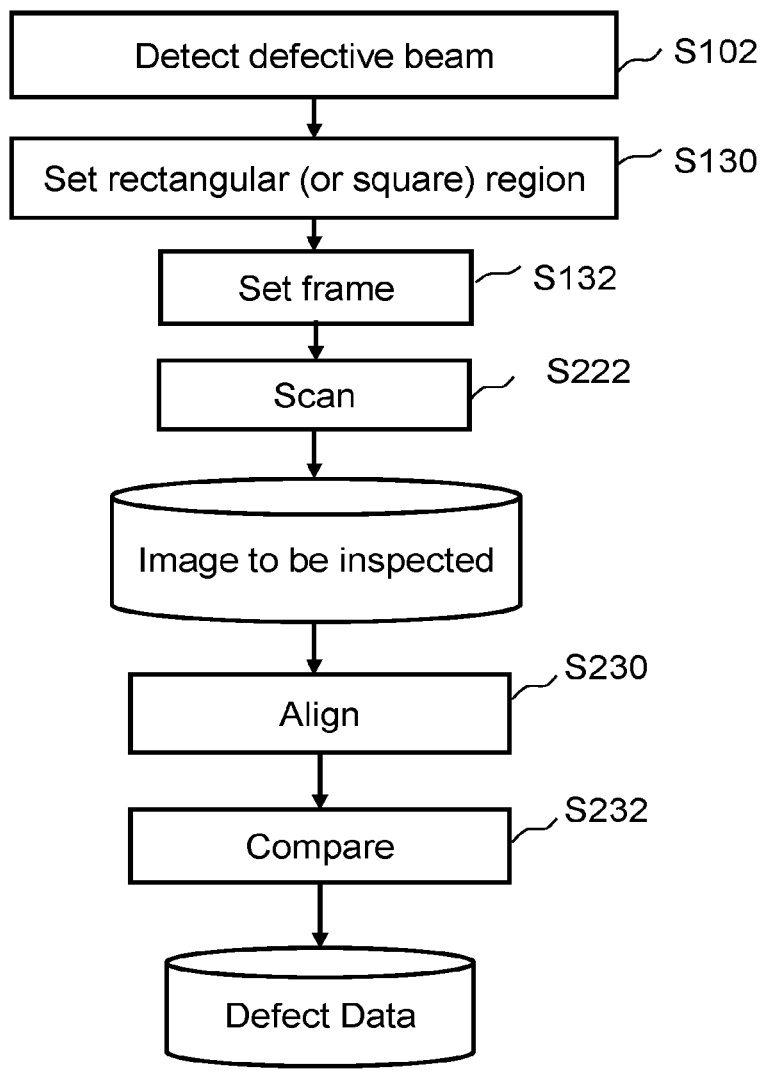
FIG. 19 is a flowchart showing main steps of an inspection method according to the third embodiment.

FIG. 19 is a flowchart showing main steps of an inspection method according to the third embodiment. In FIG. 19, the inspection method of the third embodiment executes a series of steps: the defective beam detecting step (S102), a rectangular (or "square") region setting step (S130), a frame setting step (S132), a scanning step (S222), an alignment step (S230), and a comparison step (S232).

The contents of the defective beam detecting step (S102) are the same as those of the first embodiment. However, the number of defective beams to be detected in the third embodiment differs from that of the first embodiment.

Figure 20:
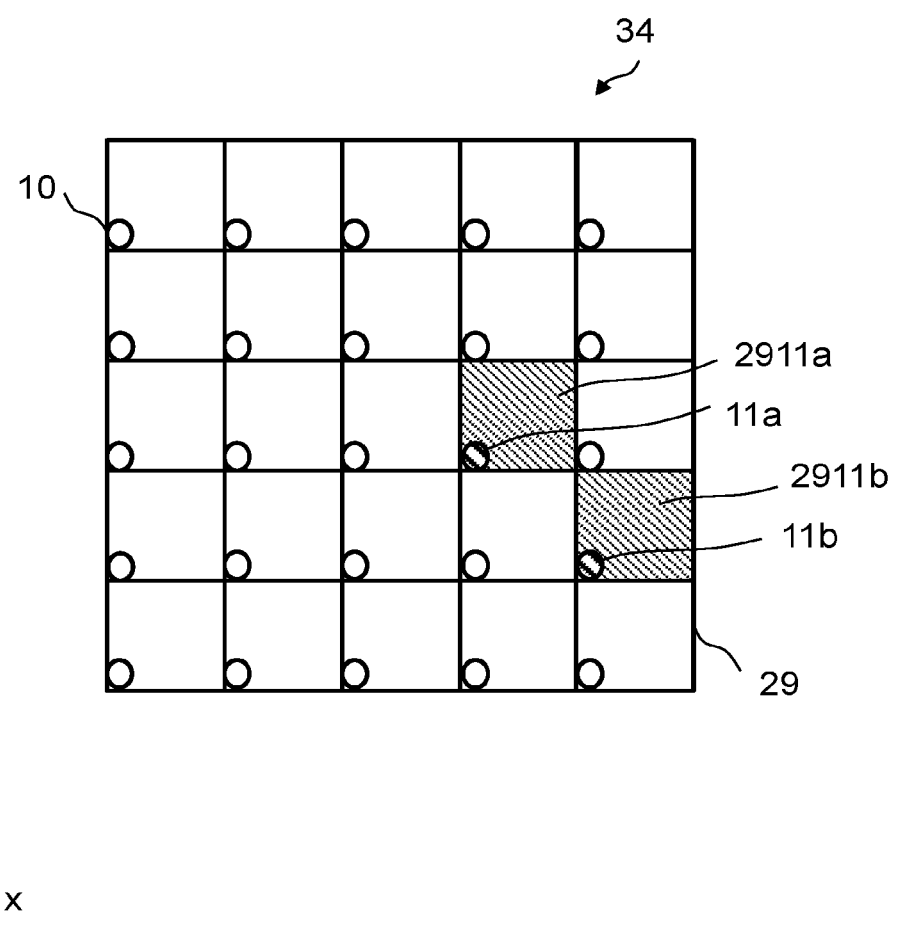
FIG. 20 shows an example of an irradiation region of multiple primary electron beams, and a sub-irradiation region to be irradiated by a defective beam, according to the third embodiment.

FIG. 20 shows an example of an irradiation region of multiple primary electron beams, and a sub-irradiation region to be irradiated by a defective beam, according to the third embodiment. FIG. 20 shows the case of the multiple primary electron beams 20 of 5 rows×5 columns, for example. Regarding the lower left corner as a reference point, FIG. 20 shows the case where a plurality of defective beams are detected; for example, the defective beam 11a at the fourth column in the x direction and the third row in the y direction, and the defective beam 11b at the fifth column in the x direction and the second row in the y direction. In such a case, compared with the image of the sub-irradiation region 29 scanned by each normal primary electron beam 10, the image of the sub-irradiation region 2911a scanned by the defective beam 11a and the image of the sub-irradiation region 2911b scanned by the defective beam 11b are images with degraded accuracy. Although FIG. 20 shows the case of a plurality of defective beams 11a and 11b being detected, the number of defective beams may be one.

In the rectangular region setting step (S130), the rectangular region setting unit 68 sets a rectangular (or "square") region such that, when the multiple primary electron beams 20 of m rows×n columns (m and n are integers of 2 or more) include the defective beam 11, the area of the rectangular region to be irradiated with normal beams excluding the defective beam 11 can be as large as possible, preferably the largest.

Figure 21:
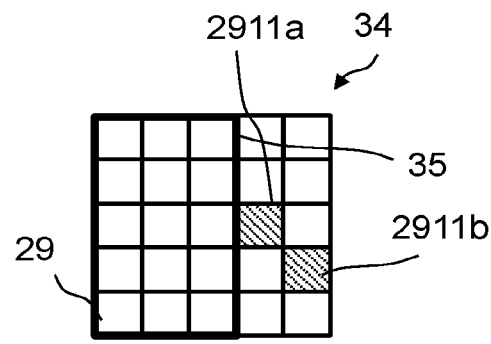
FIG. 21 shows an example of a rectangular (or "square") region to be irradiated by normal beams according to the third embodiment.

FIG. 21 shows an example of a rectangular (or "square") region to be irradiated by normal beams according to the third embodiment. FIG. 21 shows the case of the multiple primary electron beams 20 of 5 rows×5 columns, for example. In the example of FIG. 21, the sub-irradiation regions 2911a and 2911b to be irradiated by the defective beams 11a and 11b are generated at the fourth and fifth columns in the x direction. Therefore, the rectangular region setting unit 68 sets a rectangular (or "square") region 35 whose area is as large as possible, preferably the largest, to be irradiated by normal beams excluding the defective beams 11a and 11b. In the case of FIG. 21, the size of five rows by three columns of the sub-irradiation regions 29, located at the left side, serves as the largest rectangular region 35. The closer to the edge (end) a defective beam is located, the larger the rectangular region 35 can be set. Conversely, when a defective beam exists in the center, the rectangular region 35 to be set becomes small.

In the frame setting step (S132), when the multiple primary electron beams 20 of m rows×n columns (m and n are integers of 2 or more) includes the defective beams 11a and 11b, the frame setting unit 69 (region setting unit) sets a plurality of frame regions 33 by virtually dividing the chip 332 (beam irradiation target region) of the substrate 101 by the size of the rectangular region 35 that can be irradiated with normal beams excluding the defective beams 11a and 11b.

Figure 22:
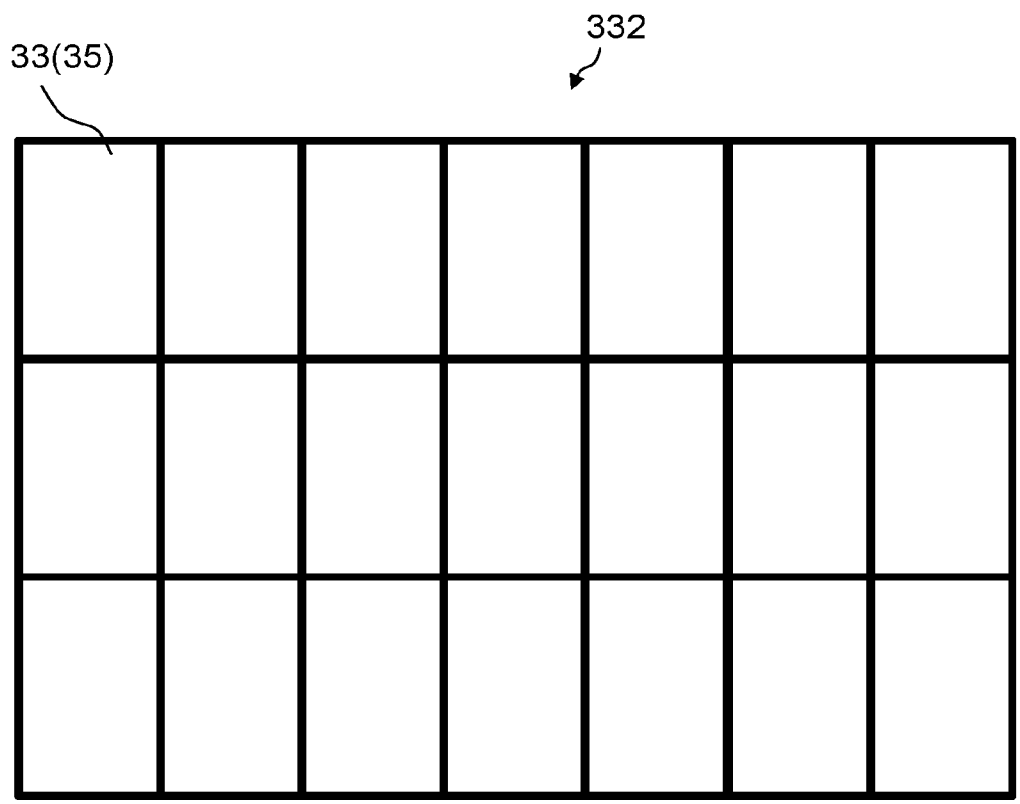
FIG. 22 shows an example of a frame region used for scanning according to the third embodiment.

FIG. 22 shows an example of a frame region used for scanning according to the third embodiment. For example, defining the lower left corner as a reference point, the frame setting unit 69 divides the chip 332 region into a plurality of frame regions 33 by the size of the sub-irradiation regions 29 of 3 rows by 5 columns to be irradiated by the multiple primary electron beams 20 of 3 rows by 5 columns. As shown in FIG. 22, a plurality of frame regions 33 are set such that they contact with each other.

In the scanning step (S222), for each of a plurality of frame regions 33, the image acquisition mechanism 150 acquires a secondary electron image of the frame region 33 concerned by detecting the multiple secondary electron beams 300 emitted from the frame region 33 concerned due to being irradiated by beams which can irradiate at least the rectangular region 35 in normal beams of the multiple primary electron beams 20 of m rows×n columns excluding the defective beams 11a and 11b. As described above, reflected electrons and secondary electrons may be projected on the multi-detector 222, or alternatively, after reflected electrons having been emitted along the way, only remaining secondary electrons may be projected thereon. Since the inspection apparatus 100 does not form (write) a pattern on the substrate 101, the substrate 101 may be irradiated by extra beams as long as there is no possibility of damaging the substrate 101 or interfering with other sub-irradiation regions 29. What is necessary is to be able to make a choice about detected intensity data of a secondary electron beam used for an inspection image. Therefore, there is no particular necessity of restricting the number of the multiple primary electron beams 20 to be applied to the substrate 101. In the case of FIG. 22, the multiple primary electron beams 20 of 5 rows×5 columns including the defective beams 11a and 11b may be used as they are for scanning. However, for each frame region 33, the image acquisition mechanism 150 aligns the position of the irradiation region of beams which can irradiate the rectangular region 35 with the frame region 33 concerned so that the beams which can irradiate the rectangular region 35 can scan the frame region 33 concerned. Then, the image of each frame region 33 is acquired due to the irradiation by the beams which can irradiate the rectangular region 35.

As described above, for acquiring an image, the multiple primary electron beams 20 are applied to the substrate 101 so that the multi-detector 222 may detect the multiple secondary electron beams 300, including reflected electrons, emitted from the substrate 101 by the irradiation with the multiple primary electron beams 20. Detected data (measured image: secondary electron image: image to be inspected) on a secondary electron detected by the multi-detector 222 is output to the detection circuit 106 in order of measurement. In the detection circuit 106, the detected data in analog form is converted into digital data by an A-D converter (not shown), and stored in the chip pattern memory 123. Thus, the image acquisition mechanism 150 acquires a measured image of a pattern formed in each frame region 33. Then, the acquired measured image data is transmitted to the comparison circuit 108, together with information on each position from the position circuit 107.

Since each frame region 33 is scanned by beams all of which are normal, it is possible to obtain necessary images of all the sub-irradiation regions 29 by performing the scanning step (S222) once. However, if the size of the rectangular region 35 to be irradiated by the normal beams is small, the scanning time takes long. Therefore, according to the third embodiment, when the defective beam 11 is located close to or near the end side, the size of the rectangular region 35 can be set to be large, which is particularly effective.

The comparison circuit 108 (inspection unit) inspects the acquired secondary electron image. The contents of each of the alignment step (S230) and the comparison step (S232) which perform inspection processing are the same as those of the first embodiment.

As described above, according to the third embodiment, even when a defective beam exists in multiple electron beams, beam irradiation achieving desired accuracy can be performed. Furthermore, according to the third embodiment, since a frame region which is not to be irradiated by defective beams can be set, it is sufficient to perform the scanning operation once.

Fourth Embodiment

In the above first to third embodiments, the image of each region can be measured even when a defective beam exists.

However, with respect to the first embodiment, although high speed can be achieved because the region of the second scanning can be reduced, it is difficult to apply this embodiment when a defective beam is located at one of the four corners, or a plurality of defective beams are detected. With respect to the second embodiment, although this embodiment can be employed and performed even when a plurality of defective beams are detected, since it is necessary to perform the entire-region scanning step twice, this embodiment is not suitable for achieving high speed. With respect to the third embodiment, although it is sufficient to perform the entire-region scanning step once, the total scanning time is greatly dependent on the size of the rectangular region 35. Therefore, in order to demonstrate the effects of the first to third embodiments largely, preferably maximally, it is desirable that each embodiment is employed and performed under suitable conditions. Then, a fourth embodiment describes a configuration in which it is possible to select each method of the first to third embodiments. The contents of the fourth embodiment are the same as those of the first embodiment except what is particularly described below.

Figure 23:
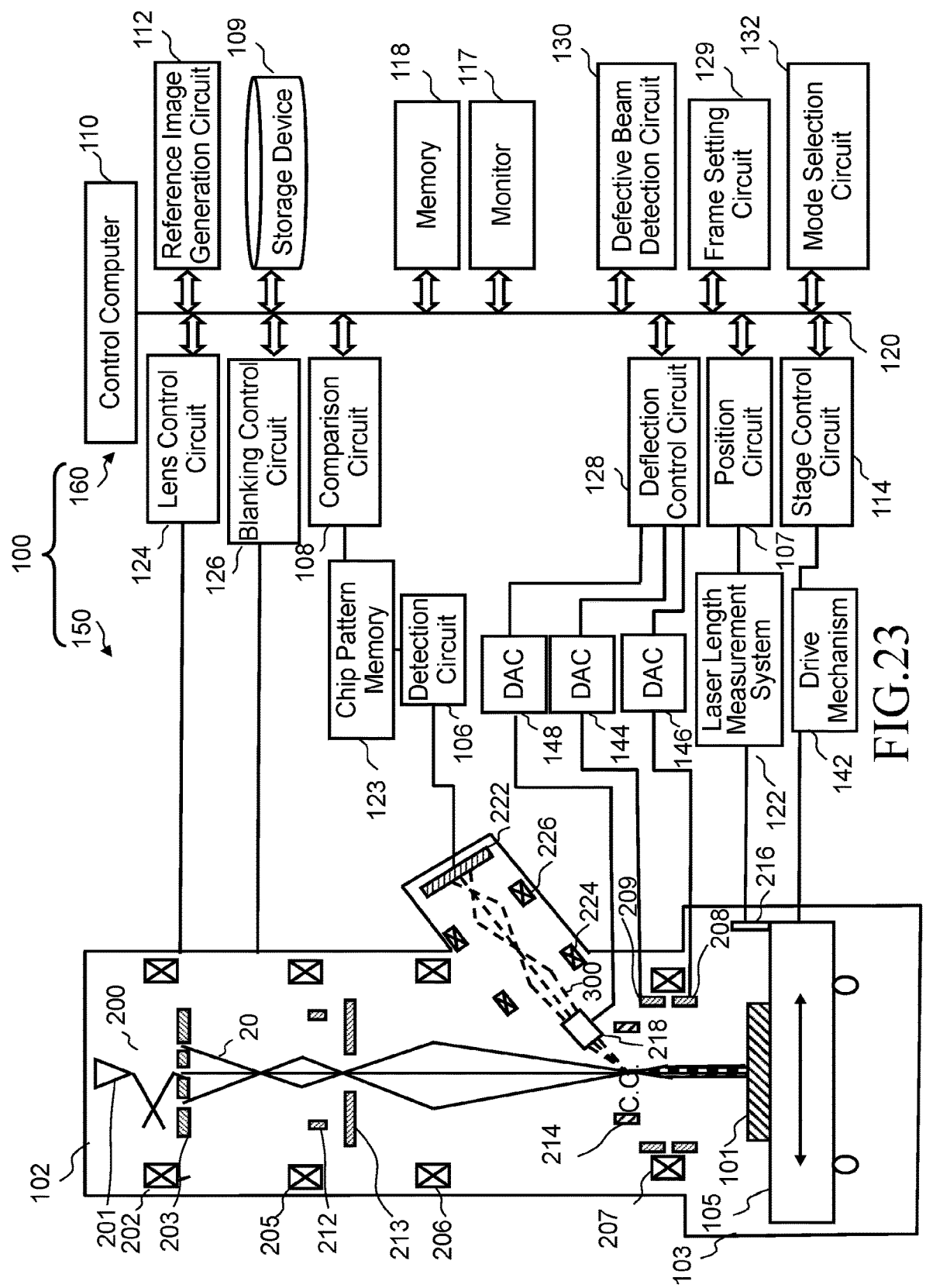
FIG. 23 is a block diagram showing an example of a configuration of a pattern inspection apparatus according to a fourth embodiment.

FIG. 23 is a block diagram showing an example of a configuration of a pattern inspection apparatus according to the fourth embodiment. FIG. 23 is the same as FIG. 1 except that a mode selection circuit 132 is added. As shown in FIG. 23, in the control system circuit 160, the control computer 110 which controls the whole of the inspection apparatus 100 is connected, through the bus 120, to the position circuit 107, the comparison circuit 108, the reference image generation circuit 112, the stage control circuit 114, the lens control circuit 124, the blanking control circuit 126, the deflection control circuit 128, the frame setting circuit 129, the defective beam detection circuit 130, the mode selection circuit 132, the storage device 109 such as a magnetic disk drive, the monitor 117, and the memory 118. In the frame setting circuit 129, there are individually arranged the configurations of the frame setting circuit 129 according to the first to third embodiments.

Figure 24:
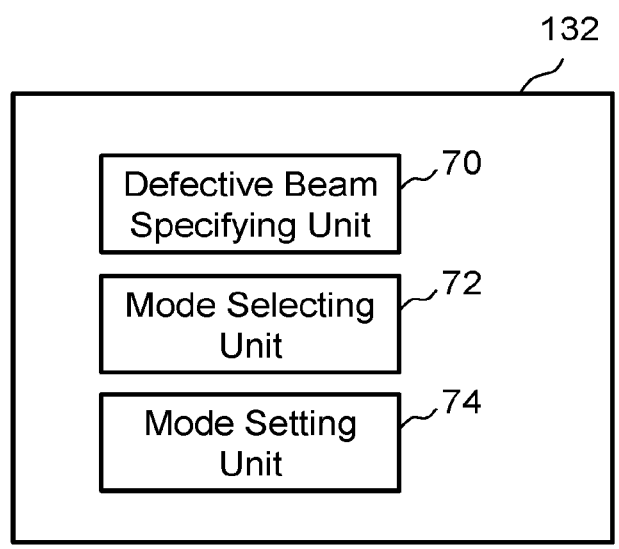
FIG. 24 is a block diagram showing an example of a configuration of a mode selection circuit according to the fourth embodiment.

FIG. 24 is a block diagram showing an example of a configuration of the mode selection circuit 132 according to the fourth embodiment. In FIG. 24, a defective beam specifying unit 70, a mode selecting unit 72, and a mode setting unit 74 are arranged in the mode selection circuit 132. Each of the "units" such as the defective beam specifying unit 70, the mode selecting unit 72, and the mode setting unit 74 includes processing circuitry. As the processing circuitry, for example, an electric circuit, computer, processor, circuit board, quantum circuit, semiconductor device, or the like can be used. Moreover, each of the "units" may use common processing circuitry (the same processing circuitry), or different processing circuitry (separate processing circuitry). Input data needed in the defective beam specifying unit 70, the mode selecting unit 72, and the mode setting unit 74, and calculated results are stored in a memory (not shown) or in the memory 118 each time.

Figure 25:
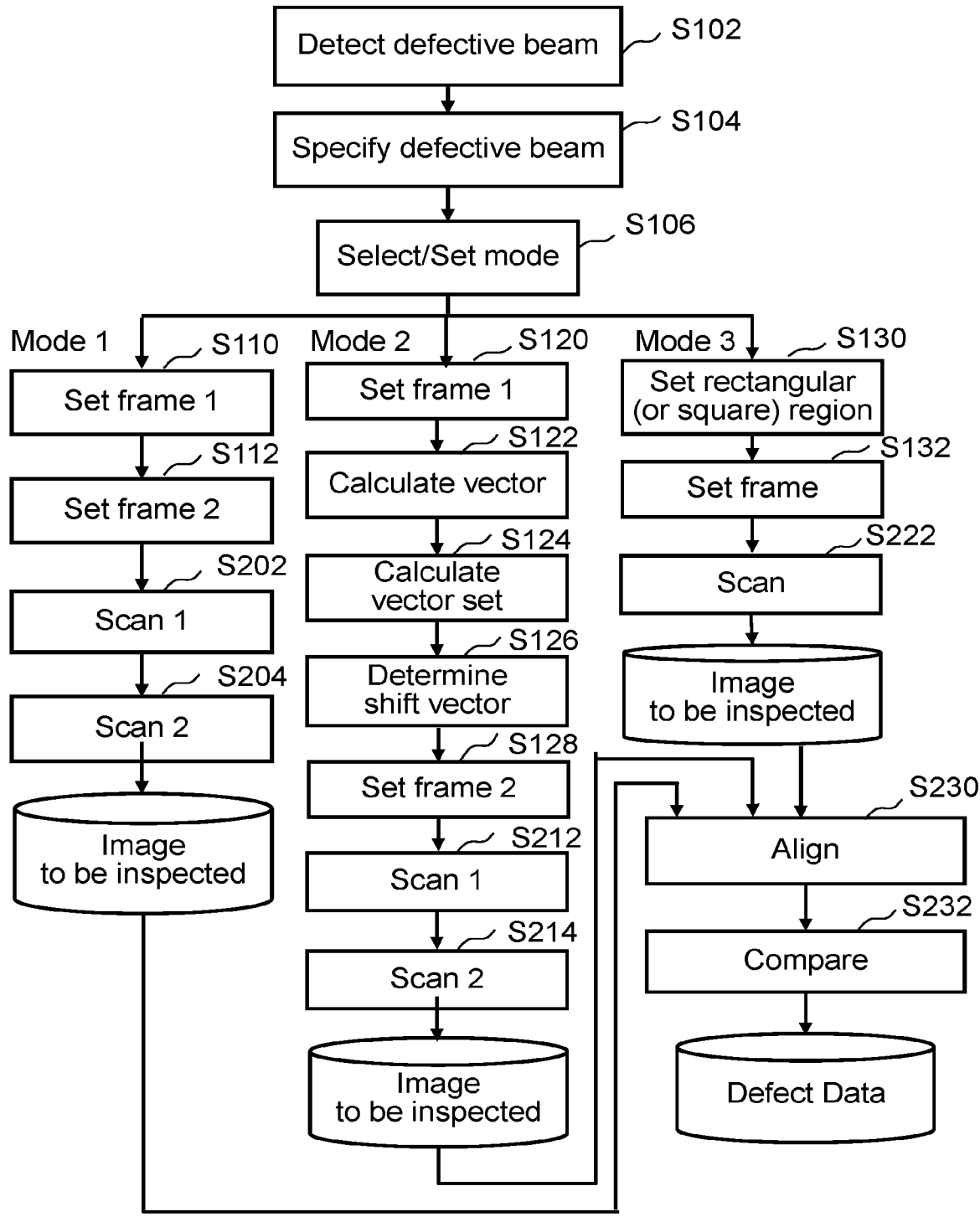
FIG. 25 is a flowchart showing main steps of an inspection method according to the fourth embodiment.

FIG. 25 is a flowchart showing main steps of an inspection method according to the fourth embodiment. In FIG. 25, the inspection method of the fourth embodiment executes a series of steps: the defective beam detecting step (S102), a defective beam specifying step (S104), a mode selecting/setting step (S106), each step in the mode 1 (the first embodiment), each step in the mode 2 (the second embodiment), each step in the mode 3 (the third embodiment), the alignment step (S230), and the comparison step (S232). As the each step in the mode 1 (the first embodiment), there are the frame 1 setting step (S110), the frame 2 setting step (S112), the scanning 1 step (S202), and the scanning 2 step (S204). As the each step in the mode 2 (the second embodiment), there are the frame 1 setting step (S120), the vector calculation step (S122), the vector set calculation step (S124), the shift vector determination step (S126), the frame 2 setting step (S128), the scanning 1 step (S212), and the scanning 2 step (S214). As the each step in the mode 3 (the third embodiment), there are the rectangular region setting step (S130), the frame setting step (S132), and the scanning step (S222).

The contents of the defective beam detecting step (S102) are the same as those of the first embodiment.

In the defective beam specifying step (S104), the defective beam specifying unit 70 (specifying unit) specifies a defective beam in the multiple primary electron beams 20 of m rows×n columns (m and n are integers of 3 or more). Specifically, it specifies the position of the detected defective beam 11. If a plurality of defective beams 11 are detected, the position of each defective beam 11 is specified.

In the mode selecting/setting step (S106), the mode selecting unit 72 (selecting unit) selects, depending on the position of the specified defective beam 11, one of a plurality of modes 1 to 3 (plural irradiation processing methods) in which the irradiation processing time is shortest. The mode setting unit 74 sets this selected mode. For example, when the positions of all the defective beams 11 are located at the end part (peripheral part) of the multiple primary electron beams 20 of m rows×n columns (m and n are integers of 3 or more), the total scanning time is shortest by using the mode 3 (the third embodiment) for acquiring an image because the scanning step is performed once and the scanning region is the frame region 33 which is a large one. For example, when the position of the defective beam 11 is located not at the peripheral part of the multiple primary electron beams 20 but at the inside of them, and the number of defective beams is one, the total scanning time is shortest by using the mode 1 (the first embodiment) for acquiring an image because even when the scanning step is performed twice, the second scanning step can be executed at high speed. For example, when a plurality of defective beams 11 exist and at least one of them is located not at the peripheral part of the multiple primary electron beams 20 but at the inside of them, there is a possibility of the irradiation processing time becoming shorter by using the mode 2 (the second embodiment) for acquiring an image than that by using the mode 3 (the third embodiment) for acquiring it. For example, when the size of the rectangular region 35 is less than half of the sub-irradiation region 29 of m rows×n columns, the total scanning time can be shorter by using the mode 2 (the second embodiment) than that by using the mode 3 (the third embodiment). For example, when defective beams simultaneously exist in the upper and lower regions of the frame region, when defective beams simultaneously exist in the right and left regions of the frame region, when a plurality of defective beams exist in the central region of the frame region, or the like, there is a high possibility that the size of the rectangular region 35 is less than half of the sub-irradiation region 29 of m rows×n columns. Thus, the appropriate mode varies depending on the position of the defective beam 11. Therefore, according to the fourth embodiment, the method is accomplished, not by calculating the irradiation processing time in all the three modes, but by selecting a suitable mode from a plurality of modes 1 to 3 (plural irradiation processing methods) just depending on the position of a specified defective beam 11.

The image acquisition mechanism 150 (electron beam irradiation mechanism) performs irradiation processing of the multiple primary electron beams 20 on the substrate 101 based on one selected method (mode). Specifically, it operates as follows:

In the case of the mode 1 (the first embodiment) being selected, the frame 1 setting step (S110), the frame 2 setting step (S112), the scanning 1 step (S202), and the scanning 2 step (S204) are performed. The contents of each of the frame 1 setting step (S110), the frame 2 setting step (S112), the scanning 1 step (S202), and the scanning 2 step (S204) are the same as those of the first embodiment.

In the case of the mode 2 (the second embodiment) being selected, the frame 1 setting step (S120), the vector calculation step (S122), the vector set calculation step (S124), the shift vector determination step (S126), the frame 2 setting step (S128), the scanning 1 step (S212), and the scanning 2 step (S214) are performed. The contents of each of the frame 1 setting step (S120), the vector calculation step (S122), the vector set calculation step (S124), the shift vector determination step (S126), the frame 2 setting step (S128), the scanning 1 step (S212), and the scanning 2 step (S214) are the same as those of the second embodiment.

In the case of the mode 3 (the third embodiment) being selected, the rectangular region setting step (S130), the frame setting step (S132), and the scanning step (S222) are performed. The contents of each of the rectangular region setting step (S130), the frame setting step (S132), and the scanning step (S222) are the same as those of the third embodiment.

The comparison circuit 108 (inspection unit) inspects an acquired secondary electron image. The contents of each of the alignment step (S230) and the comparison step (S232) which perform inspection processing are the same as those of the first embodiment.

As described above, according to the fourth embodiment, even when a defective beam exists in multiple electron beams, beam irradiation achieving desired accuracy can be performed in the mode providing a short irradiation processing time being automatically suitable for generation conditions of the defective beam.

Fifth Embodiment

Each Embodiment described above describes the inspection apparatus 100. However, the irradiation method of multiple electron beams which takes measures against a defective beam is not limited thereto. A fifth embodiment describes a configuration applied to the writing apparatus.

Figure 26:
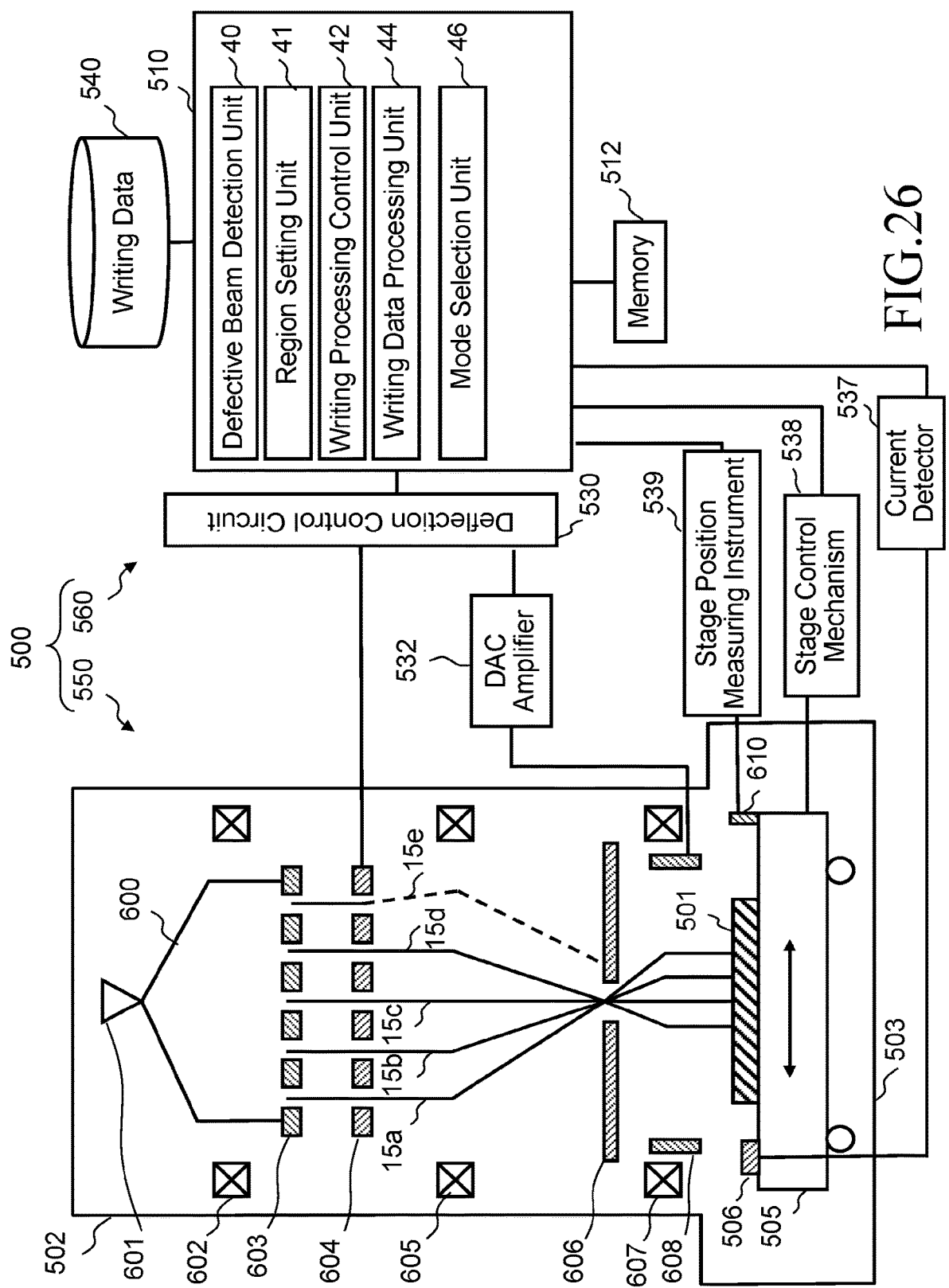
FIG. 26 is a conceptual diagram showing a configuration of a writing apparatus according to a fifth embodiment.

FIG. 26 is a conceptual diagram showing a configuration of a writing or "drawing" apparatus according to a fifth embodiment. As shown in FIG. 26, a writing apparatus 500 includes a writing mechanism 550 (electron beam irradiation mechanism) and a control system circuit 560. The writing apparatus 500 is an example of a multiple electron beam writing apparatus. The writing mechanism 550 includes an electron optical column 502 and a writing chamber 503. In the electron optical column 502, there are disposed an electron gun 601, an illumination lens 602, a shaping aperture array substrate 603, a blanking aperture array mechanism 604, a reducing lens 605, a limiting aperture substrate 606, an objective lens 607, and a deflector 608. In the writing chamber 503, an XY stage 505 is disposed. On the XY stage 505, a target object or "sample" 501 such as a mask serving as a writing target substrate is placed when writing (exposure) is performed. The target object 501 is, for example, an exposure mask used when fabricating semiconductor devices, or a semiconductor substrate (silicon wafer) for fabricating semiconductor devices. Moreover, the target object 501 may be, for example, a mask blank on which resist has been applied and nothing has yet been written. Further, on the XY stage 505, a mirror 610 for measuring the position of the XY stage 505 is placed. Furthermore, on the XY stage 505, a Faraday cup 506 for detecting the current is disposed. An electromagnetic lens is used as the illumination lens 602, the reducing lens 605, and the objective lens 607. Each electromagnetic lens refracts multiple beams (electron beams). A plurality of holes 22 for forming multiple electron beams 15 are formed in the shaping aperture array substrate 603 similarly to FIG. 2.

The control system circuit 560 includes a control computer 510, a memory 512, a deflection control circuit 530, a DAC (digital-analog converter) amplifier unit 532, a stage control mechanism 538, a stage position measuring instrument 539, and a storage device 540 such as a magnetic disk drive. The control computer 510, the memory 512, the deflection control circuit 530, the stage control mechanism 538, the stage position measuring instrument 539, and the storage device 540 are connected with each other through a bus (not shown). Writing data is input from the outside of the writing apparatus 500 into the storage device 540 (storage unit) and stored therein. The deflection control circuit 530 is connected to the DAC amplifier unit 532 and the blanking aperture array mechanism 604 through a bus (not shown). The stage position measuring instrument 539 irradiates the mirror 610 on the XY stage 505 with a laser beam, and receives a reflected light from the mirror 610. Then, using information of the reflected light, the stage position measuring instrument 539 measures the position of the XY stage 505.

In the control computer 510, there are arranged a defective beam detection unit 40, a region setting unit 41, a writing processing control unit 42, a writing data processing unit 44, and a mode selection unit 46. Each of the " . . . units" such as the defective beam detection unit 40, the region setting unit 41, the writing processing control unit 42, the writing data processing unit 44, and the mode selection unit 46 includes processing circuitry. As the processing circuitry, for example, an electric circuit, computer, processor, circuit board, quantum circuit, or semiconductor device is used. Each " . . . unit" may use common processing circuitry (the same processing circuitry), or different processing circuitry (separate processing circuitry). Information input/output to/from the defective beam detection unit 40, the region setting unit 41, the writing processing control unit 42, the writing data processing unit 44, and the mode selection unit 46, and information being operated are stored in the memory 512 each time.

FIG. 26 shows a configuration necessary for describing the fifth embodiment. Other configuration elements generally necessary for the writing apparatus 500 may also be included therein.

Figure 27:
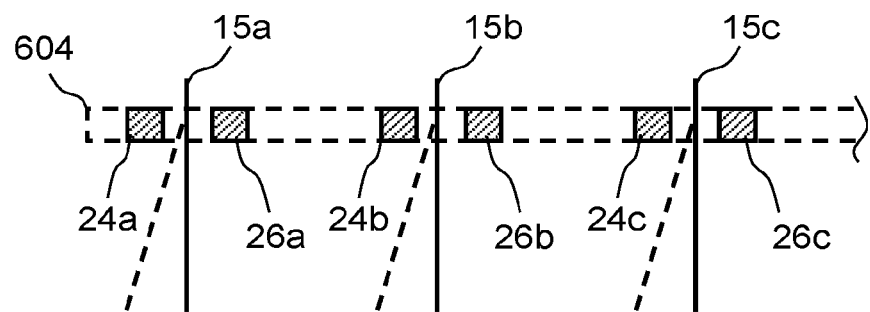
FIG. 27 is a sectional view showing an example of a configuration of a blanking aperture array mechanism according to the fifth embodiment.

FIG. 27 is a sectional view showing an example of a configuration of the blanking aperture array mechanism 604 according to the fifth embodiment. As shown in FIG. 27, similarly to FIG. 2, in the blanking aperture array mechanism 604, passage holes (openings), through each of which a corresponding one of multiple primary electron beams passes, are formed at positions each corresponding to each hole 22 in the shaping aperture array substrate 603. In other words, in the blanking aperture array mechanism 604, there are formed a plurality of passage holes in an array through each of which a corresponding beam 15 of multiple primary electron beams passes. Moreover, there are arranged a plurality of electrode pairs each composed of two electrodes being opposite to each other with respect to a corresponding one of a plurality of passage holes. Specifically, each pair (blanker: blanking deflector) of a control electrode 24 and a counter electrode 26 for blanking deflection is arranged close to a corresponding passage hole 25 in a manner such that the electrodes 24 and 26 are opposite to each other across the passage hole 25 concerned. Moreover, close to each passage hole, there is arranged a control circuit (logic circuit) (not shown) for each beam which applies a deflection voltage to the control electrode 24 for the passage hole concerned. The counter electrode 26 for each beam is grounded. The control circuit for each beam is controlled by the deflection control circuit 530.

The electron beam 15 passing through a corresponding passage hole is deflected by a voltage independently applied to a pair of the control electrode 24 and the counter electrode 26. Blanking control is provided by this deflection. Specifically, a pair of the control electrode 24 and the counter electrode 26 individually provides blanking deflection of a corresponding beam of multiple beams by an electric potential switchable by a switching circuit (not shown). Thus, each of a plurality of blankers performs blanking deflection of a corresponding beam in the multiple beams having passed through a plurality of holes 22 (openings) in the shaping aperture array substrate 603.

Next, operations of the writing mechanism 550 will be described. The electron beam 600 emitted from the electron gun 601 (emission source) almost perpendicularly (e.g., vertically) illuminates the whole of the shaping aperture array substrate 603 by the illumination lens 602. A plurality of rectangular (including square, etc.) holes 22 (openings) are formed in the shaping aperture array substrate 603. The region including all the plurality of holes 22 is irradiated by the electron beam 600. For example, a plurality of rectangular, including a square, electron beams (multiple beams) $15a$ to $15e$ are formed by letting portions of the electron beam 600, irradiating the positions of a plurality of holes 22, individually pass through a corresponding hole of the plurality of holes 22 in the shaping aperture array substrate 603. The multiple electron beams individually pass through corresponding blankers (a pair of the control electrode 24 and the counter electrode 26) of the blanking aperture array mechanism 604. The blanker provides blanking control such that at least the electron beam 15 individually passing through the blanker becomes in the ON state during a writing time (irradiation time) having been set.

The multiple electron beams $15a$ to $15e$ having passed through the blanking aperture array mechanism 604 are reduced by the reducing lens 605, and go toward the hole in the center of the limiting aperture substrate 606. Then, the electron beam 15 which was deflected by the blanker of the blanking aperture array mechanism 604 deviates (shifts) from the hole in the center of the limiting aperture substrate 606 (blanking aperture member), and is blocked by the limiting aperture substrate 606. On the other hand, the electron beam 15 which was not deflected by the blanker of the blanking aperture array mechanism 604 passes through the hole in the center of the limiting aperture substrate 606 as shown in FIG. 26. Thus, the limiting aperture substrate 606 blocks each beam which was deflected to be in the OFF condition. Then, beam of each one shot is formed by a beam which has been made during a period from becoming beam ON to becoming beam OFF and has passed through the limiting aperture substrate 606. The multiple electron beams 15 having passed through the limiting aperture substrate 606 are focused by the objective lens 607 so as to be a pattern image of a desired reduction ratio. Then, respective beams (all the multiple beams 15) having passed through the limiting aperture substrate 606 are collectively deflected in the same direction by the deflector 608 controlled by the deflection control circuit 530, to irradiate respective beam irradiation positions on the target object 501. Moreover, while the XY stage 505 is continuously moving, the deflector 608 performs controlling so that the irradiation positions of the beams may follow the movement of the XY stage 505. Ideally, the multiple beams 15 irradiating at a time are aligned at the pitch obtained by multiplying the arrangement pitch of a plurality of holes 22 in the shaping aperture array substrate 603 by the desired reduction ratio described above.

In multiple electron beam writing, a pattern is written by irradiating the sub-irradiation region 29 of each frame region 33 by each associated electron beam. As described above, a defective beam may be generated also in the multiple electron beams. Then, according to the fifth embodiment, the irradiation methods described in the first to fourth embodiments are applied to multiple electron beam writing.

In the defective beam detecting step, after limiting the multiple electron beams 15 to a beam, one by one, by using the blanking aperture array mechanism 604, the writing mechanism 550 applies the beam, one by one, to the Faraday cup 506 and detects the current amount applied on the Faraday cup 506 by a current detection machine 537. This operation is carried out for each beam of the multiple electron beams 15. When there is a beam which is always ON, it is difficult for the blanking aperture array mechanism 604 to control it to be beam OFF. Therefore, a structure is separately configured such that a shutter mechanism in which a hole is formed for selectively making a beam pass therethrough and being movable, for example, in the horizontal direction is arranged in order to provide blanking of the "always ON" beam.

Next, the defective beam detection unit 40 detects a defective beam, based on a current amount difference among multiple electron beams 15. For example, if there is a beam which is always OFF, its current amount is zero. Information on a detected defective beam 11 is output to the mode selection unit 46.

Next, in the mode selecting/setting step, the mode selecting unit 46 (selecting unit) selects, depending on the position of the specified defective beam 11, one of a plurality of modes 1 to 3 (plural irradiation processing methods) in which the irradiation processing time is shortest. The writing processing control unit 42 sets this selected mode. For example, when the positions of all the defective beams 11 are located at the end part (peripheral part) of the multiple electron beams 15 of m rows×n columns (m and n are integers of 3 or more), the total writing time is shortest by using the mode 3 (the third embodiment) for performing writing because the writing processing is performed once and the writing region is the frame region 33 which is a large one. For example, when the position of the defective beam 11 is located not at the peripheral part of the multiple electron beams 15 but at the inside of them, and the number of defective beams is one, the total writing time is shortest by using the mode 1 (the first embodiment) for performing writing because even when the writing processing is performed twice, the second writing processing can be executed at high speed. For example, when a plurality of defective beams 11 exist and at least one of them is located not at the peripheral part of the multiple electron beams 15 but at the inside of them, there is a possibility of the irradiation processing time becoming shorter by using the mode 2 (the second embodiment) for performing writing than that by using the mode 3 (the third embodiment) for performing writing. For example, when the size of the rectangular region 35 is less than half of the sub-irradiation region 29 of m rows×n columns, the total writing time can be shorter by using the mode 2 (the second embodiment) than that by using the mode 3 (the third embodiment). For example, when defective beams simultaneously exist in the upper and lower parts, when defective beams simultaneously exist in the right and left parts, when a defective beam exists in the central part, or the like, there is a high possibility that the size of the rectangular region 35 is less than half of the sub-irradiation region 29 of m rows×n columns. Thus, the appropriate mode varies depending on the position of the defective beam 11. Therefore, according to the fifth embodiment, the method is accomplished, not by calculating the irradiation processing time in all the three modes, but by selecting a suitable mode from a plurality of modes 1 to 3 (plural irradiation processing methods) just depending on the position of a specified defective beam 11.

However, according to the fifth embodiment, with respect to a defective beam which is always OFF, or the defective beam 11 controllable to be OFF by the blanking aperture array mechanism 604, the appropriate mode is selected from the modes 1 to 3. With respect to a defective beam which is always ON, or the defective beam 11 uncontrollable to be OFF by the blanking aperture array mechanism 604, since irradiation by the defective beam cannot be excluded (eliminated) by the blanking aperture array mechanism 604, the mode 3 is selected. However, a movable shied which can block the beams outside the rectangular region 35 is arranged in advance. For example, a shield is arranged at the downstream side of the shaping aperture array substrate 603 or the blanking aperture array mechanism 604.

The writing mechanism 550 (electron beam irradiation mechanism) performs irradiation processing of the multiple electron beams 15 on the substrate 101 in accordance with one selected method (mode). Specifically, it operates as follows:

First, the writing data processing unit 44 reads writing data from the storage device 540, and calculates the irradiation time of each pixel obtained by dividing the writing region of the target object 501 into grids. Preferably, this irradiation time is calculated considering the proximity effect. For example, the irradiation time can be calculated by dividing, by the current density, the value obtained by multiplying the reference dose, the pattern area density of a pixel, and the coefficient for proximity effect correction of the pixel concerned. Data of the calculated irradiation time is output to the deflection control circuit 530 in order of shot. It is preferable that the pixel size is set to be about the same size as the beam size of each of the multiple electron beams.

In the case of the mode 1 (the first embodiment) being selected, the frame 1 setting step (S110), the frame 2 setting step (S112), a writing 1-1 step, and a writing 2-1 step are performed. The contents of each of the frame 1 setting step (S110) and the frame 2 setting step (S112) are the same as those of the first embodiment. However, setting the frame regions 33-1 and 33-2 is performed by the region setting unit 41.

In the writing 1-1 step, when one defective beam 11 exists at the position other than the four corners of the multiple electron beams 15 of m rows×n columns (m and n are integers of 3 or more), the writing mechanism 550 performs the first writing processing (irradiation processing) with the multiple electron beams 15 for each of a plurality of frame regions 33-1 (the first frame region) of the target object 501, using normal beams in the remaining beams obtained by excluding the beams in one row and one column at the end of the multiple electron beams 15. Specifically, it operates as follows: First, the beams in one row and one column at the end and the defective beam 11 of the multiple electron beams 15 are controlled to be beam OFF by using the blanking aperture array mechanism 604. While moving the stage 505, which is controlled by the stage control mechanism 538, at the constant speed V1, the writing processing is performed.

Each beam of the multiple electron beams 15 is applied to the sub-irradiation region 29 concerned surrounded by the pitch between the beams in the x direction and the pitch between the beams in the y direction such that the beam concerned itself is located therein. Then, while scanning the sub-irradiation region 29 concerned, the beam is applied to a necessary pixel during a needed irradiation time. Each electron beam of the multiple electron beams 15 is associated with any one of the sub-irradiation regions 29 which are different from each other. At the time of each shot, each electron beam is applied to the same position in the associated sub-irradiation region 29. Moreover, at the time of each shot, each electron beam is applied to an irradiation target pixel in the associated sub-irradiation region 29 during a calculated irradiation time. The electron beam is moved in the sub-irradiation region 29 by collective deflection of all the multiple electron beams 15 by the deflector 608. By repeating this operation, the inside of one sub-irradiation region 29 is irradiated, in order, with one electron beam. When writing one sub-irradiation region 29 is completed, the irradiation position is moved to an adjacent frame region 33-1 in the same stripe region 32 by collectively deflecting all the multiple electron beams 15 by the deflector 608. By repeating this operation, the inside of the stripe region 32 is irradiated in order. After writing one stripe region 32 is completed, the irradiation position is moved to the next stripe region 32 by moving the stage 505 and/or by collectively deflecting all the multiple electron beams 15 by the deflector 608. Thus, a predetermined pattern is written by combining shot pixel figures in the sub-irradiation region 29 obtained by irradiation by each electron beam as described above.

In the writing 2-1 step, using the beams at the four corners of the multiple electron beams 15 of m rows×n columns, the writing mechanism 550 performs the second writing processing (irradiation processing) of the multiple electron beams for each of a plurality of frame regions 33-2 of the substrate 501. Specifically, it operates as follows: When writing, beams other than the beams at the four corners of the multiple electron beams 15 are controlled to be beam OFF by using the blanking aperture array mechanism 604.

With respect to the first writing step (writing 1-1), the sub-irradiation region 29 equivalent to the irradiation position of the defective beam 11 has not been written. Therefore, in the second writing step (writing 2-1), it is necessary to normally perform writing of the sub-irradiation region 29 equivalent to the irradiation position of the defective beam 11. Thus, the sub-irradiation region 29 equivalent to the irradiation position of the defective beam 11 is written only by the beams at the four corners of the multiple electron beams of m rows×n columns.

With respect to a plurality of frame regions 33-2, since they are set at intervals as shown in FIG. 9, the area of the whole region to be scanned can be smaller than the total area of a plurality of frame regions 33-1. In the case of FIG. 9, the area of the whole region to be scanned is reduced by the ratio obtained by dividing the area of one frame region 33-2 by the total area of four frame regions 33-1. Thus, the stage speed can be increased by the ratio of the area reduction. Therefore, the moving speed of the stage 505 in the second writing operation (writing 2-1) (the second irradiation processing of multiple electron beams) becomes faster than that in the first writing operation (writing 1-1), (the first irradiation processing of multiple electron beams). Accordingly, the writing time of the second writing (writing 2-1) can be much reduced compared to that of the first writing (writing 1-1).

In the case of the mode 2 (the second embodiment) being set, the frame 1 setting step (S120), the vector calculation step (S122), the vector set calculation step (S124), the shift vector determination step (S126), the frame 2 setting step (S128), a writing 1-2 step, and a writing 2-2 step are performed. The contents of each of the frame 1 setting step (S120), the vector calculation step (S122), the vector set calculation step (S124), the shift vector determination step (S126), and the frame 2 setting step (S128) are the same as those of the second embodiment. However, setting the frame regions 33-1 and 33-2 is performed by the region setting unit 41.

In the writing 1-2 step, using normal beams of the multiple electron beams 15 of m rows×n columns, the writing mechanism 550 performs the first writing processing (irradiation processing) of the multiple electron beams 15 for each of a plurality of frame regions 33-1. When writing, a plurality of defective beams 11 of the multiple electron beams 15 are controlled to be beam OFF by using the blanking aperture array mechanism 604.

In the writing 2-2 step, using normal beams which are in the multiple electron beams 15 of m rows×n columns and in association with irradiation positions to be irradiated by a plurality of defective beam 11 in the first writing processing of the multiple electron beams 15, the writing mechanism 550 performs the second writing processing (irradiation processing) of the multiple electron beams 15 for each of a plurality of frame regions 33-2. When writing, after excluding beams associated with the sub-irradiation regions 29 which were not written by a plurality of defective beam 11 of the multiple electron beams 15, the remaining beams are controlled to be beam OFF by using the blanking aperture array mechanism 604.

In the case of the mode 3 (the third embodiment) being set, the rectangular region setting step (S130), the frame setting step (S132), and a writing 1-3 are performed. The contents of each of the rectangular region setting step (S130) and the frame setting step (S132) are the same as those of the third embodiment. However, setting the frame regions 33 and the rectangular region 35 is performed by the region setting unit 41.

In the writing 1-3 step, for each of a plurality of frame regions 33, the writing mechanism 550 writes a pattern in the frame region 33 concerned using beams which can irradiate the rectangular region 35 in the normal beams excluding defective beams of the multiple electron beams 15 of m rows×n columns described above. When writing, the beams which irradiate outside the rectangular region 35 are controlled to be OFF by the blanking aperture array mechanism 604, or blocked by a movable shield (not shown). In other words, when at least one defective beam is specified, and the position(s) of all beam(s) (the at least one defective beam) is located at the peripheral part of the multiple electron beams 15, the selected mode 3 (one method) is performed as follows: the region setting unit 41 sets a plurality of frame regions 33 obtained by virtually dividing the beam irradiation target region of the target object by the size of the rectangle which can be irradiated by the normal beams excluding defective beams, and the writing mechanism 550 (electron beam irradiation mechanism) irradiates a plurality of frame regions 33 in order by beams, in the normal beams, which can irradiate at least inside the rectangle.

As described above, according to the fifth embodiment, even when a defective beam exists in multiple electron beams 15, beam irradiation (writing) achieving desired accuracy can be performed in the mode suitable for generation conditions of the defective beam.

In the above description, each " . . . circuit" includes processing circuitry. As the processing circuitry, for example, an electric circuit, computer, processor, circuit board, quantum circuit, semiconductor device, or the like can be used. Each " . . . circuit" may use common processing circuitry (the same processing circuitry), or different processing circuitry (separate processing circuitry). A program for causing a processor to execute processing or the like may be stored in a recording medium, such as a magnetic disk drive, magnetic tape drive, FD, ROM (Read Only Memory), etc. For example, the position circuit 107, the comparison circuit 108, the reference image generation circuit 112, the stage control circuit 114, the lens control circuit 124, the blanking control circuit 126, the deflection control circuit 128, the frame setting circuit 129, the defective beam detection circuit 130, and the mode selection circuit 132 may be configured by at least one processing circuit described above.

Embodiments have been explained referring to specific examples described above. However, the present invention is not limited to these specific examples. Although FIG. 1 describes the case where the multiple primary electron beams 20 (multiple electron beams 15) are formed by the shaping aperture array substrate 203 (603) irradiated with one beam from one irradiation source, namely, the electron gun 201 (601), it is not limited thereto. The multiple primary electron beams 20 (multiple electron beams 15) may be formed by individual irradiation with primary electron beams from a plurality of irradiation sources.

While the apparatus configuration, control method, and the like not directly necessary for explaining the present invention are not described, some or all of them can be appropriately selected and used on a case-by-case basis when needed.

In addition, any other multiple electron beam inspection apparatus and multiple electron beam inspection method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multiple electron beam irradiation apparatus comprising:
   a stage which mounts thereon a target object;
   a first region setting circuit, in a case of a defective beam existing at a position other than four corners of multiple electron beams of m rows×n columns (where m and n are integers of 3 or more), which sets a first frame region of a plurality of first frame regions obtained by virtually dividing a beam irradiation target region of the target object by a size of an irradiation region which can be irradiated with remaining beams after excluding beams in one row and one column at end from the multiple electron beams;
   a second region setting circuit which sets a second frame region of a plurality of second frame regions each having four corners equivalent to an irradiation position of the defective beam in a case of performing first multiple electron beam irradiation processing for each of the plurality of first frame regions by using normal beams in the remaining beams; and
   an electron beam irradiation mechanism which performs the first multiple electron beam irradiation processing for the each of the plurality of first frame regions of the target object by using the normal beams, and perform second multiple electron beam irradiation processing for each of the plurality of second frame regions by using at least beams at the four corners.

2. The apparatus according to claim 1, further comprising:
   a stage drive mechanism which moves the stage,
   wherein the first multiple electron beam irradiation processing and the second multiple electron beam irradiation processing are performed while moving the stage,
   the plurality of first frame regions are set to contact with each other, and the plurality of second frame regions are set not to contact with each other, and
   the stage drive mechanism makes a moving speed of the stage in the second multiple electron beam irradiation processing faster than that in the first multiple electron beam irradiation processing.

3. A multiple electron beam irradiation apparatus comprising:
   a stage which mounts thereon a target object;
   a first region setting circuit which sets a first frame region of a plurality of first frame regions obtained by virtually dividing a beam irradiation target region of the target object by a size of an irradiation region which can be irradiated with multiple electron beams of m rows×n columns (where m and n are integers of 3 or more);
   a vector calculation circuit, in a case of the multiple electron beams including a plurality of defective beams, which calculates a vector between regions equivalent to irradiation positions of the plurality of defective beams in a case where first multiple electron beam irradiation processing is performed for each of the plurality of first frame regions by using normal beams of the multiple electron beams;
   a second region setting circuit which sets a second frame region of a plurality of second frame regions obtained by shifting the plurality of first frame regions to a vector which does not belong to a set of calculated vectors between the regions; and
   an electron beam irradiation mechanism which performs the first multiple electron beam irradiation processing for the each of the plurality of first frame regions by using the normal beams, and perform second multiple electron beam irradiation processing for each of the plurality of second frame regions by using normal beams which are associated with the irradiation positions of the plurality of defective beams in the second frame region.

4. The apparatus according to claim 3, wherein the set of vectors between the regions is composed of a plurality of vectors whose absolute value of an x value is less than m being an interval between beam indexes in an x direction of the multiple electron beams of m rows×n columns, and whose absolute value of a y value is less than n being an interval between beam indexes in a y direction.

5. A multiple electron beam irradiation method comprising:

setting, in a case of a defective beam existing at a position other than four corners of multiple electron beams of m rows×n columns (where m and n are integers of 3 or more), a first frame region of a plurality of first frame regions obtained by virtually dividing a beam irradiation target region of a target object placed on a stage by a size of an irradiation region which can be irradiated with remaining beams after excluding beams in one row and one column at end from the multiple electron beams;

setting a second frame region of a plurality of second frame regions each having four corners equivalent to an irradiation position of the defective beam in a case of performing first multiple electron beam irradiation processing for each of the plurality of first frame regions by using normal beams in the remaining beams;

performing the first multiple electron beam irradiation processing for the each of the plurality of first frame regions of the target object by using the normal beams; and performing second multiple electron beam irradiation processing for each of the plurality of second frame regions by using at least beams at the four corners.

6. The method according to claim 5, wherein the plurality of first frame regions are set to contact with each other, and the plurality of second frame regions are set not to contact with each other.

* * * * *